US010199424B1

(12) United States Patent
Kropelnicki et al.

(10) Patent No.: US 10,199,424 B1
(45) Date of Patent: Feb. 5, 2019

(54) THERMOELECTRIC-BASED INFRARED DETECTOR HAVING A CAVITY AND A MEMS STRUCTURE DEFINED BY BEOL METALS LINES

(71) Applicant: Meridian Innovation Pte Ltd, Singapore (SG)

(72) Inventors: Piotr Kropelnicki, Singapore (SG); Ilker Ender Ocak, Singapore (SG); Paul Simon Pontin, Singapore (SG)

(73) Assignee: MERIDIAN INNOVATION PTE LTD, Singapore (SG)

( * ) Notice: Subject to any disclaimer, the term of this patent is extended or adjusted under 35 U.S.C. 154(b) by 0 days.

(21) Appl. No.: 15/653,558

(22) Filed: Jul. 19, 2017

(51) Int. Cl.
*H01L 27/146* (2006.01)
*G01J 5/02* (2006.01)
(Continued)

(52) U.S. Cl.
CPC .......... *H01L 27/1465* (2013.01); *G01J 5/12* (2013.01); *G01J 5/20* (2013.01); *H01L 27/1469* (2013.01); *H01L 27/14629* (2013.01); *H01L 27/14636* (2013.01); *H01L 27/14685* (2013.01); *H01L 27/14689* (2013.01)

(58) Field of Classification Search
CPC ......... H01L 27/14685; H01L 27/14683; H01L 27/14687; H01L 27/14689; H01L 27/1469; H01L 27/1465; H01L 27/14634; H01L 27/14636; H01L 27/14661; H01L 27/14669; H01L 27/1467; H01L 27/14649; H01L 23/5222; H01L 23/5223;
(Continued)

(56) References Cited

U.S. PATENT DOCUMENTS 6,359,276 B1 *  3/2002  Tu .............................. G01J 5/20
                                                              250/332
7,755,048 B2   7/2010  Hsu
(Continued)

OTHER PUBLICATIONS

J. H. Smith et al., Embedded Micromechanical Devices for the Monolithic Integration of MEMS with CMOS, IEEE International Electron Devices Meeting, Dec. 10-13, 1995, pp. 1-5, Sandia National Labs., Albuquerque, New Mexico, U.S.A.

*Primary Examiner* — Marc Armand
*Assistant Examiner* — Younes Boulghassoul
(74) *Attorney, Agent, or Firm* — Horizon IP Pte Ltd.

(57) ABSTRACT

Device and method of forming a device are disclosed. The device includes a substrate with a transistor component disposed in a transistor region and a micro-electrical mechanical system (MEMS) component disposed on a membrane over a lower sensor cavity in a hybrid region. The MEMS component serves as thermoelectric-based infrared sensor, a thermopile line structure which includes an absorber layer disposed over a portion of oppositely doped first and second line segments. A back-end-of-line (BEOL) dielectric is disposed on the substrate having a plurality of inter layer dielectric (ILD) layers with metal and via levels. The ILD layers include metal lines and via contacts for interconnecting the components of the device. The metal lines in the metal levels are configured to define a BEOL or an upper sensor cavity over the lower sensor cavity, and metal lines of a first metal level of the BEOL dielectric are configured to define a geometry of the MEMS component.

20 Claims, 18 Drawing Sheets

(51) Int. Cl.
*G01J 5/12* (2006.01)
*G01J 5/20* (2006.01)

(58) Field of Classification Search
CPC ..... H01L 23/5228; G01J 5/0225; G01J 5/024; G01J 5/12; G01J 5/20; G01J 5/10
See application file for complete search history.

(56) References Cited

U.S. PATENT DOCUMENTS

| | | |
|---|---|---|
| 9,324,760 B2 | 4/2016 | Vasseur et al. |
| 9,577,001 B2* | 2/2017 | Enichlmair ............. G01J 5/048 |
| 2007/0057343 A1 | 3/2007 | Chinthakindi et al. |
| 2008/0216883 A1 | 9/2008 | Leneke et al. |
| 2010/0243892 A1* | 9/2010 | Dupont .................... G01J 5/02 |
| | | 250/332 |
| 2011/0147869 A1 | 6/2011 | Lazarov et al. |
| 2012/0061569 A1 | 3/2012 | Noguchi |
| 2012/0097415 A1* | 4/2012 | Reinert ............ H01L 27/14618 |
| | | 174/50 |
| 2015/0076651 A1 | 3/2015 | Noguchi |
| 2015/0168221 A1 | 6/2015 | Mao et al. |
| 2015/0177069 A1 | 6/2015 | Maes et al. |
| 2016/0079306 A1* | 3/2016 | Kropelnicki ............ H01L 27/16 |
| | | 257/467 |
| 2016/0289063 A1* | 10/2016 | Ocak .................... B81B 7/0048 |
| 2018/0029882 A1* | 2/2018 | Cheng ................ B81C 1/00238 |
| 2018/0148326 A1* | 5/2018 | Cheng ................ B81C 1/00246 |
| 2018/0208460 A1* | 7/2018 | Chiu ................... B81C 1/00246 |

\* cited by examiner

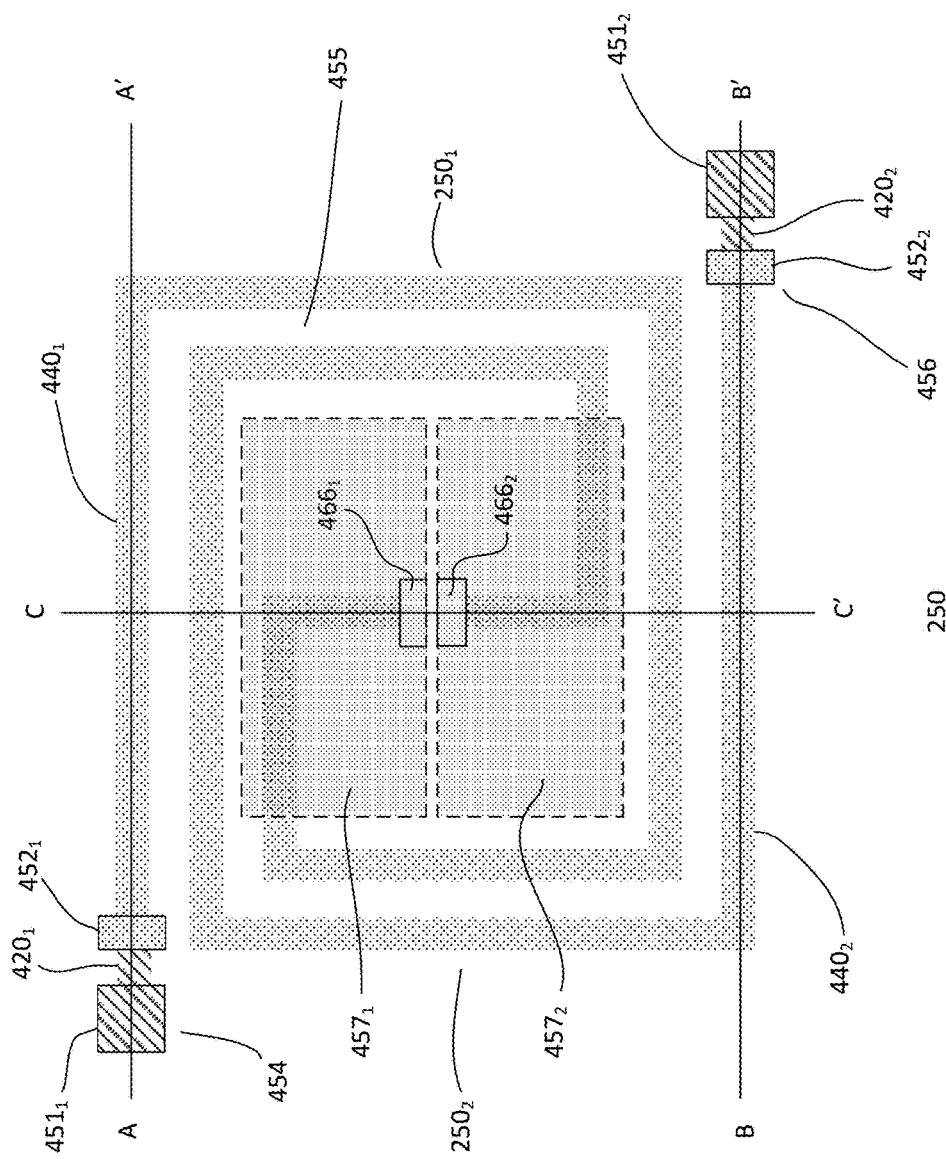

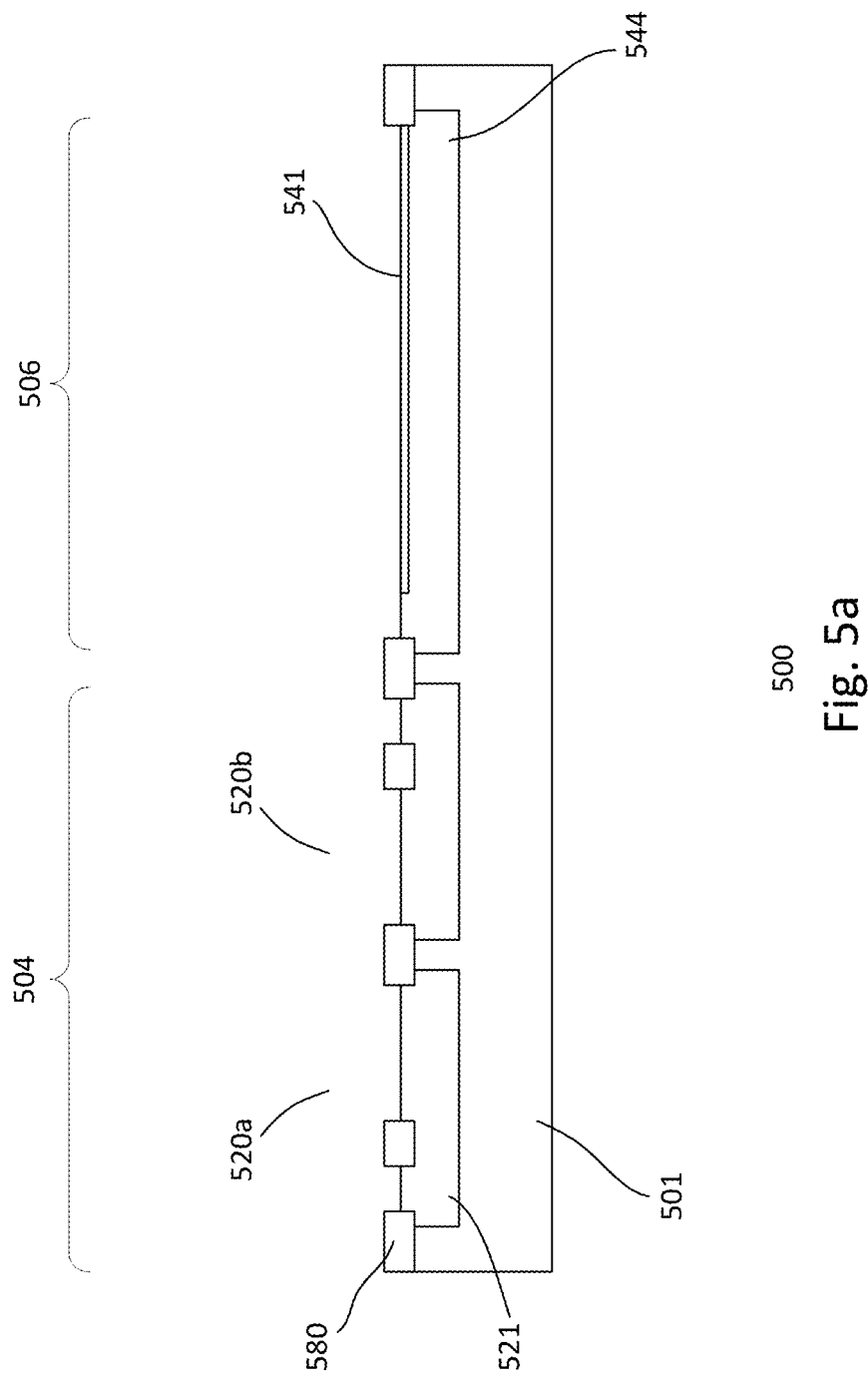

THERMOELECTRIC-BASED INFRARED DETECTOR HAVING A CAVITY AND A MEMS STRUCTURE DEFINED BY BEOL METALS LINES

BACKGROUND

The demand for uncooled infrared detectors is continually growing due to the increased demand from numerous applications. These applications, just to name a few, include air conditioning systems, handphones, autonomous driving cars, internet of things (IoT), fire-fighting and traffic safety. Furthermore, it is expected that there will be numerous more applications in the near future.

Conventional uncooled infrared detectors have been implemented using microbolometers. However, microbolometers require mechanical components for calibration purposes. As an example, microbolometers require mechanical shutters for offset correction. The required mechanical components for microbolometers increases manufacturing complexity. Such complexity increases cost. In addition, the need for mechanical components for microbolometers makes it difficult to produce small or compact devices.

The present disclosure is directed to cost effective and compact infrared detectors.

SUMMARY

Embodiments of the present disclosure generally relate to devices and methods of forming thereof. In one embodiment, the device includes a substrate with a transistor region and a hybrid region. A transistor component is disposed in the transistor region and a micro-electrical mechanical system (MEMS) component is disposed on a membrane over a lower sensor cavity in the hybrid region. The MEMS component includes a plurality of MEMS active and passive components which serve as thermoelectric-based infrared sensor and includes a thermopile line structure. The thermopile line structure includes an absorber layer disposed over a portion of oppositely doped first and second line segments which are connected in series to ensure electrical continuity. A back-end-of-line (BEOL) dielectric disposed on the substrate having a plurality of inter layer dielectric (ILD) layers with metal and via levels for interconnecting the components of the device. The metal lines in the metal levels are configured to define a BEOL or an upper sensor cavity over the lower sensor cavity, and metal lines of a first metal level of the BEOL dielectric are configured to define a geometry of the MEMS component.

In another embodiment, a method of forming the device is disclosed and includes processing a substrate by disposing a transistor component in the transistor region and disposing a MEMS component on a membrane over a lower sensor cavity in the hybrid region. The MEMS component includes a plurality of MEMS active and passive components which serve as thermoelectric-based infrared sensor. Each thermoelectric-based infrared sensor includes a thermopile line structure which includes an absorber layer disposed over a portion of oppositely doped first and second line segments which are connected in series to ensure electrical continuity. The method of forming the device continues by disposing a BEOL dielectric on the substrate. The BEOL dielectric have a plurality of ILD layers with metal and via levels for interconnecting the components of the device. The metal lines in the metal levels are configured to define a BEOL or an upper sensor cavity over the lower sensor cavity, and metal lines of a first metal level of the BEOL dielectric are configured to define a geometry of the MEMS component.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

The accompanying drawings, which are incorporated in and form part of the specification in which like numerals designate like parts, illustrate preferred embodiments of the present disclosure and, together with the description, serve to explain the principles of various embodiments of the present disclosure.

FIGS. 4a-4d show top and cross-sectional views of various embodiments of thermopile structures;

FIGS. 5a-5g show cross-sectional views of an exemplary process for forming a device.

DETAILED DESCRIPTION

Embodiments generally relate to devices, for example, semiconductor devices or integrated circuits (ICs) with thermoelectric-based infrared detectors. The IC, for example, is a complementary metal oxide semiconductor (CMOS) device. As for the infrared detector, it is, for example, a micro-electrical mechanical system (MEMS). The MEMS detector is embedded into the IC with high CMOS integration. Furthermore, the MEMS detector is compatible with CMOS processing. The devices can be incorporated into products, such as thermal imagers. For example, a device may include a plurality of MEMS sensors which can be configured to form a sensor array for a thermal imager. The sensors may be used for other types of applications, such as single pixel or line array temperature or motion sensors.

The fabrication of devices may involve the formation of features on a substrate that makes up circuit components, such as transistors, resistors, capacitors and MEMS sensors. The components are interconnected, enabling the device to perform the desired functions. To form the features and interconnections, layers are repeatedly deposited on the substrate and patterned as desired using lithographic techniques. For example, a wafer is patterned by exposing a photoresist layer with an exposure source using a reticle containing the desired pattern. After exposure, the photoresist layer is developed, transferring the pattern of the reticle to the photoresist layer. This forms a photoresist etch mask. An etch is performed using the etch mask to replicate the pattern on the wafer below, which may include one or more layers, depending on the stage of the process. In the formation of the devices, numerous reticles may be used for different patterning processes. Furthermore, a plurality of devices may be formed on the wafer in parallel.

Figure 1:
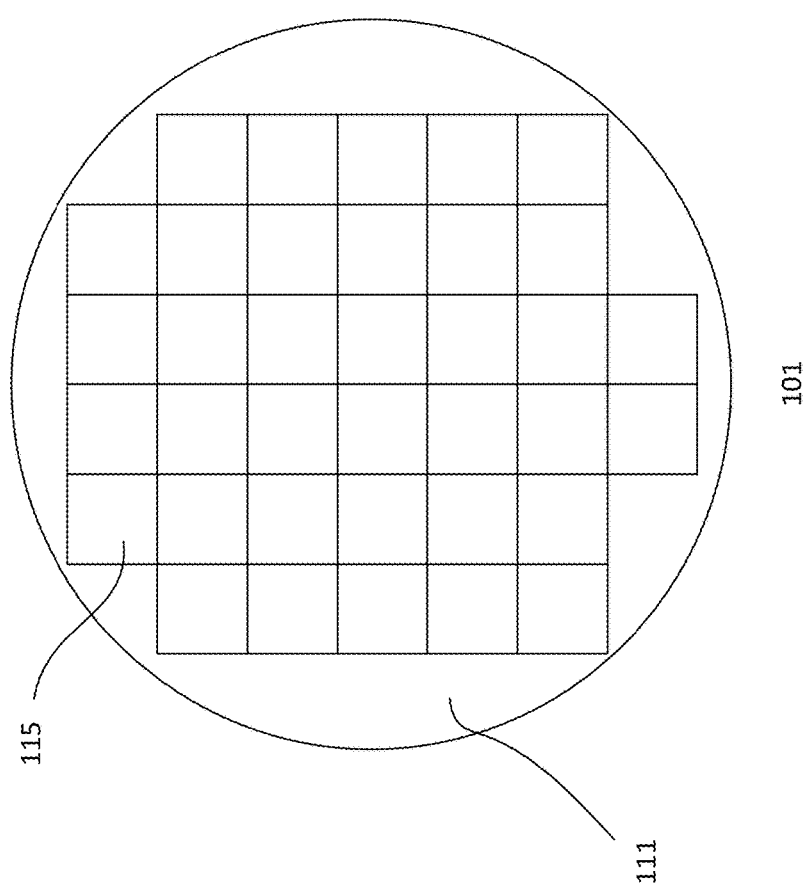
FIG. 1 shows a top view of a semiconductor wafer.

FIG. 1 shows a simplified plan view of an embodiment of a semiconductor wafer 101. The semiconductor wafer, for example, may be a silicon wafer. The wafer may be a lightly doped p-type wafer. Other types of wafers, such as silicon-on-insulator (SOI), or silicon germanium wafer as well as doping with other types of dopants or dopant concentrations may also be useful.

The wafer includes an active surface 111 on which a device 115 is formed. A plurality of devices may be formed on the wafer in parallel. The devices, for example, are arranged in rows along a first (x) direction and columns along a second (y) direction. Separating the devices are dicing channels. After processing is completed, the wafer is diced along the dicing channels to singulate the devices into individual chips.

Figure 2:
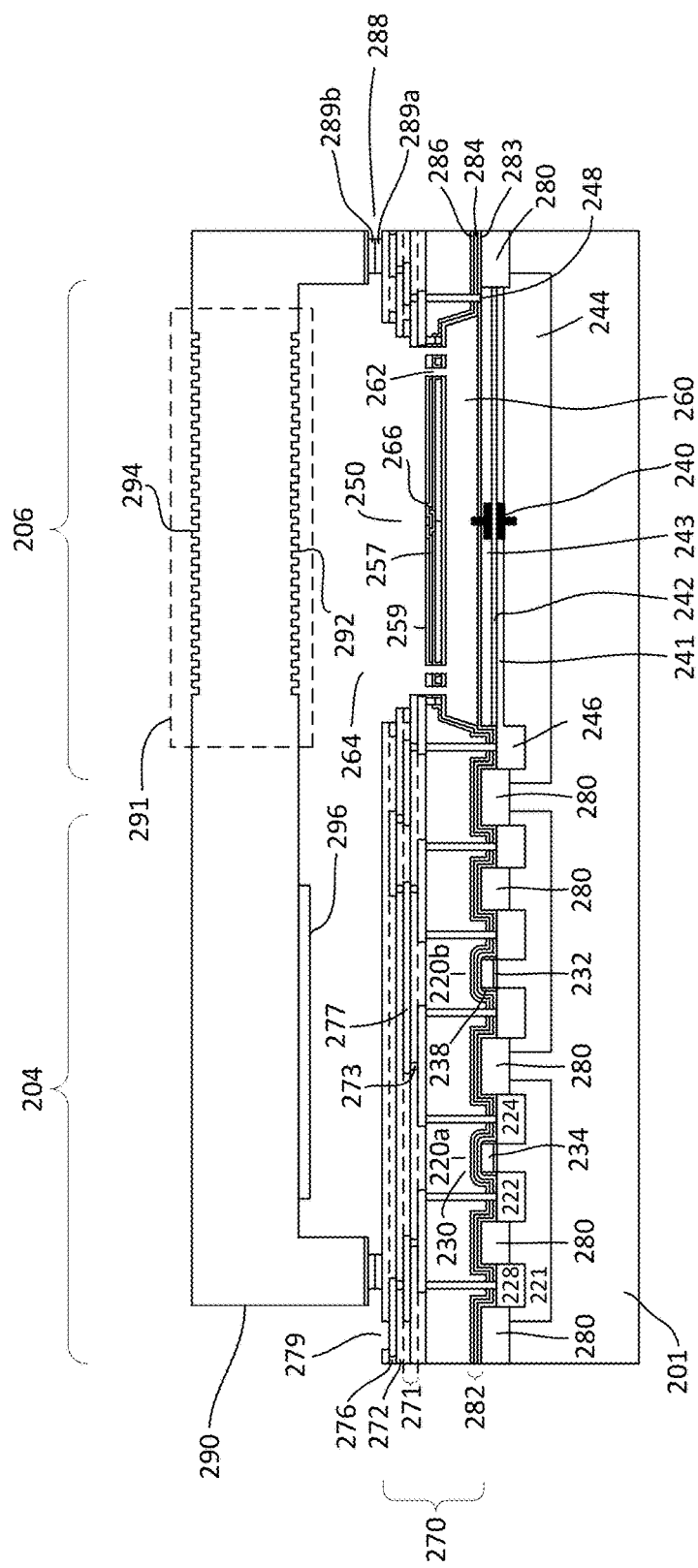
FIG. 2 shows a simplified cross-sectional view of a device.

FIG. 2 shows a simplified embodiment of a device 215. The device, for example, is a CMOS device with an embedded MEMS structure or component. In one embodiment, the device is a CMOS device embedded with a thermoelectric-based infrared sensor. In some embodiments, the MEMS structure of the device includes a plurality of thermoelectric-based infrared sensors. The plurality of sensors may be configured to form a sensor array. For example, the device may be an infrared imager in which each sensor may be a pixel of an infrared imager. Other types of MEMS structures or applications may also be useful. The device includes a substrate 201. The device, for example, may be a part of the wafer, as described in FIG. 1. Common elements may not be described or described in detail. The substrate, for example, may be a semiconductor substrate, such as a silicon substrate. The substrate, for example, may be a lightly doped p-type silicon substrate. Other types of substrates or wafers may also be useful.

In one embodiment, the substrate includes first and second device regions 204 and 206. The first region is a CMOS region while the second region is a hybrid region. The CMOS region includes CMOS components and the hybrid region includes a hybrid CMOS and MEMS components.

As shown, the CMOS region includes first and second CMOS components 220a and 220b. The CMOS components include metal oxide semiconductor (MOS) transistors. For example, the first CMOS component is a n-type MOS transistor and the second CMOS component is a p-type MOS transistor. P-type MOS transistors and n-type MOS transistors are complementary types of transistors. A transistor includes a device well 221. The device well serves as a body of the transistor. Additionally, a transistor includes a gate 230 disposed on the substrate over the device well between first and second source/drain (S/D) regions 222 and 224 disposed in the device well.

The gate of the transistor may include a gate electrode 234 over a gate dielectric 232. The gate electrode may be polysilicon and the gate dielectric may be thermal silicon oxide. Other types of materials or configurations of gates may also be useful. For a p-type MOS transistor, the device well is a n-type well and the S/D regions are heavily doped p-type regions. On the other hand, a n-type transistor has a p-type device well and heavily doped n-type S/D regions. The S/D regions may include lightly doped extension regions. The lightly doped extension regions are lightly doped with the same polarity type dopants as the heavily doped S/D regions. The sidewalls of the gate may include dielectric spacers 238. The spacers facilitate in aligning the S/D and lightly doped extension regions. A device well may include a device well contact 228 which is heavily doped with the same polarity type dopants as the device well.

The CMOS region, as shown, may be a logic region which includes first and second transistors. However, the logic region may include numerous transistors. In addition, the logic region may include regions for transistors having different operating characteristics or voltages. For example, low voltage transistors may be provided in low voltage (LV) region, intermediate or medium voltage transistor may be provided in a medium voltage (MV) region and high voltage transistors may be provided in a high voltage (HV) region. Other types of device regions may also be included. For example, a memory region may be included in which a memory array is disposed.

As discussed, the device may include a sensor array with a plurality of sensors arranged in a matrix with rows and columns of sensors. Each sensor corresponds to a pixel of an array of pixels. In such case, the CMOS components may include select switches, row and column decoders and readout circuits. Other CMOS components may also be included. The CMOS components are configured to read out each pixel of the array. Once the full array of sensors is read out, an image may be reconstructed. The image, for example, is one frame corresponding to the sensors of the array.

Isolation regions 280 are provided to isolate the component regions. For example, isolation regions are provided to isolate the first and second transistor regions as well as the hybrid region. In addition, isolation regions may be provided to isolate a device well contact from a S/D contact. The isolation regions may be field oxide (FOX) isolation regions. Other types of isolation regions, such as shallow trench isolation (STI) regions, may also be useful.

As for the hybrid region, it includes a lower sensor cavity 260 disposed on the substrate. The lower sensor cavity may have a square or rectangular footprint or shape. Other shapes for the lower sensor cavity may also be useful. The lower sensor cavity, for example, may be structured by a dielectric layer 282. In one embodiment, the dielectric layer includes a dielectric stack with a plurality of dielectric layers. As shown, the dielectric stack includes first, second and third dielectric layers 283, 284 and 286. Providing other number of dielectric layers in the stack may also be useful. The number of dielectric layers may vary depending on, for example, the device configuration. The dielectric layers, for example, may be silicon oxide, silicon nitride or a combination thereof. Other types or combination of dielectric layers may also be useful.

In one embodiment, the bottom of the lower sensor cavity includes a hybrid CMOS component. For example, the hybrid CMOS component is disposed in the hybrid region at the bottom of the lower sensor cavity. The hybrid CMOS component, in one embodiment, includes a passive CMOS component. For example, the CMOS component may be a resistor, a capacitor, an inductor, as well as connection lines to other sections of the CMOS component. Other types of CMOS components may be included in the hybrid region. For example, active CMOS components may be included in the hybrid region. In one embodiment, the hybrid CMOS component may include a plurality of hybrid CMOS components. For example, the hybrid CMOS component may include one or more hybrid CMOS components. The hybrid CMOS component may include one or more passive CMOS components. For example, the hybrid CMOS component may include capacitors, resistors or a combination thereof.

As shown, the hybrid CMOS component 240 is a capacitor having bottom and top electrodes 241 and 243 separated by a capacitor dielectric 242. In one embodiment, the bottom electrode is a doped electrode. For example, the substrate is doped with capacitor dopants to form the bottom electrode. The capacitor dopants may be first polarity type dopants. For example, the capacitor dopants may be p-type dopants. The bottom electrode may include a bottom capacitor doped electrode contact or terminal 246 which is doped with capacitor dopants. As shown, the bottom electrode contact extends outside of a first side of the lower sensor cavity.

In some embodiments, the bottom capacitor electrode may be a metal silicide bottom electrode terminal. For example, a metal silicide layer may be disposed on the substrate in the hybrid CMOS region to serve as the bottom capacitor electrode and may include the bottom capacitor terminal. In the case of a metal silicide bottom electrode, the substrate may be undoped or lightly doped with capacitor dopants. The metal silicide electrode may include a titanium (Ti), tungsten (W) or aluminum (Al) based metal silicide electrode. Other types of metal silicides may also be useful. In other embodiments, the bottom capacitor electrode may be a doped polysilicon layer disposed on the substrate surface. The polysilicon bottom capacitor electrode may include a terminal portion which is silicided. Other types or configurations of bottom capacitor electrodes may also be useful.

As for the capacitor dielectric, it may be silicon oxide layer. The top capacitor electrode may be a doped polysilicon layer. For example, the top capacitor electrode may be polysilicon doped with capacitor dopants. Alternatively, the top capacitor electrode may be a metal silicide electrode. For example, the top capacitor electrode may be a metal silicided polysilicon or silicon layer. In the case of a metal silicided polysilicon electrode, the polysilicon may be doped or undoped with capacitor dopants. Other types of electrodes may also be useful. The capacitor plates and capacitor dielectric may extend outside of a second side of the lower sensor cavity. The first and second sides may be opposite sides of the lower sensor cavity. The top capacitor plate which extends outside of the second side may serve as a top capacitor plate contact or terminal 248. Alternatively, the first and second sides may be adjacent sides or even the same side. In the case of the same side, offsets may be provided to access the different terminals.

The hybrid region may include an isolation well 244. The isolation well, for example, is a doped well. The doped well is doped with isolation dopants. In the case where the bottom electrode is a doped bottom electrode, the polarity of the isolation dopants is opposite to the polarity of the capacitor dopants. For example, if the capacitor dopants are first polarity type dopants, then the isolation dopants are second polarity type dopants. In the case of p-type capacitor dopants, the isolation dopants are n-type dopants. In the case where the bottom electrode is a doped polysilicon electrode, a dielectric layer may be provided between the electrode and substrate. In such case, an isolation well may not be needed. For example, the dielectric layer below the electrode serves as an isolation layer, avoiding the need for the isolation well.

As discussed, a dielectric layer structures the lower sensor cavity. In one embodiment, the dielectric layer 282 structures the lower sensor cavity. The dielectric layer at the top of the lower sensor cavity serves as a membrane for a MEMS structure 250. The MEMS structure, for example, is a sensor. The MEMS structure may be a thermopile sensor. The thermopile sensor may serve as a thermoelectric infrared sensor. Other types of sensors may also be useful.

In one embodiment, the thermopile sensor includes a thermopile line structure. The thermopile line structure, for example, is a polysilicon line structure doped with thermopile material. Other types of thermopile materials which are stable under high temperatures may also be useful. For example, other thermopile materials may include silicon germanium (SiGe), gallium nitride (GaN) or a 2D material, such as graphene, black phosphorus or molysulfide. The thermopile material may be a doped thermopile material. The pattern of the line structure, for example, may be a serpentine or meandering line structure.

In one embodiment, the thermopile line structure includes N line units, where N>1. For example, a thermopile line structure may include 1 (N=1) or more (N>1) line units. A line unit includes first and second segments doped with first and second thermopile dopants. The first thermopile dopants are first polarity type dopants and the second thermopile dopants are second polarity type dopants. The first and second polarity type dopants are opposite polarity type dopants. For example, the first polarity type is p-type and the second polarity type is n-type. The first and second segments, preferably, have about symmetrical lengths. For example, the lengths of the first and second segments have about the same length. This produces about symmetrical heat dissipation between the segments. In some cases, the lengths of the segments may be ±20% of each other. This produces acceptable difference in heat dissipation between the segments. The doping of the segments may, for example, be integrated into S/D doping processes of the p-type and n-type transistors. Providing separate doping processes to form the doped segments may also be useful.

In the case where the thermopile line structure includes a single line unit, the segments of the line units are disposed on a line level. For example, the first and second line segments of the line unit are disposed on the same line level over the dielectric layer.

In one embodiment, a metal contact 266 couples the first and second segments. The metal contact may be disposed at the interface of the first and second segments. In one embodiment, the metal contacts should be high temperature contacts. For example, the contacts can sustain subsequent process temperatures. The high temperature metal contact, for example, may be titanium (Ti) or aluminum (Al) contact. Other types of high temperature metal contacts may also be useful. A first thermopile terminal is disposed at a first end of the line structure and a second thermopile terminal is disposed at a second end of the line structure. The terminals, for example, may be part of the line structure.

In the case the thermopile line structure includes a multi-line unit line structure (N>1), a line unit of the multi-line unit structure is a stacked line unit. The line units of the multi-line unit line structure are coupled in series. Providing multiple line units to form a sensor improves sensor performance without increasing surface area. In one embodiment, the multi-line structure includes first and second stacked line units (N=2). Providing other number of line units for a line structure may also be useful. For example, a line structure may have 1–4 (N=1–4) line units. Preferably, a line structure has $2^N$ line units, where N=0–2. Other number of line units may also be useful.

The line units of the multi-line unit line structures preferably have similar designs. For example, the line units have similar patterns with similar line segment lengths which allow for the same cuts through the dielectric layers to the sacrificial layer for an easier release process. Providing line units having different patterns but with similar or different line segment lengths may also be useful. In addition, the line segments of a line unit may have different thicknesses. A thin polysilicon is preferred over thick polysilicon due to lesser heat dissipation to the substrate. The line structure may have other configurations.

In one embodiment, the first and second stacked line units are disposed adjacent to each other on the dielectric layer within the sensor region. A stacked line unit includes a first segment disposed in a first line level and a second line segment disposed in a second line level. The first and second line level may be separated by a dielectric layer. For example, the second line segment of a line unit is overlaid over the first line segment of the line unit and separated by an interline level dielectric layer. A contact connects the first line segment in the first line level to the second line segment in the second line segment.

The first and second line units, as discussed, are coupled in series. For example, a second terminal of the first line unit may be coupled to a first terminal of the second line unit while a first terminal of the first line unit serves as a first terminal of the multi-line unit line structure and a second terminal of the second line unit serves as a second terminal of the multi-line unit line structure. As an example, a line structure with 2 line units may be connected in series to form a n-p-n-p line structure.

In other embodiments, a plurality of line structures may be configured to form an array of line structures. For example, the array may have Y rows and Z columns of line structures, forming a Y×Z array. Each line structure is disposed on the dielectric layer or membrane defining the top of the lower sensor cavity. Each line structure corresponds to a pixel. A line structure may be have a single line unit or multiple line unit. For example, a line structure can have N line units, where N can be greater than 1 or can be equal to 1. The array of line structures may form an infrared imager having Y×Z pixels.

In the case of a polysilicon line structure, it may be formed with the polysilicon layer used to form gate electrodes. For example, the CMOS process may include a polysilicon gate electrode layer for gate electrodes and may also be employed to serve as the polysilicon line structure.

In the case where the CMOS process includes more than one polysilicon gate electrode layer, the thinner polysilicon gate electrode layer may be preferably selected to serve as a polysilicon line structure layer for forming a line unit. By using a thinner line structure layer, thermal isolation can be improved due to improved sensitivity. In another embodiment, a separate layer may be employed to serve as the line structure layer. When multiple stacked line units are employed, the segments of the stacked line units preferably have the same material and thickness. Providing line segments of a stacked line unit with different thicknesses may also be useful.

In the case of an infrared sensor, an absorber layer 257 is provided over the line structure. The absorber layer, for example, absorbs incident infrared radiation. In one embodiment, the absorber layer is disposed on a central portion of the line structure. The absorber layer is thermally coupled to a center of the line structure. The absorber layer may be a titanium nitride (TiN) layer. Other types of absorber layers may also be useful. For example, the absorber layer may be a nickel-chromium (NiCr) layer or a doped silicon layer. In one embodiment, the absorber is configured to absorb most of the incident infrared radiation. For example, the absorber may be configured to absorb greater than 85% of incident infrared radiation having a wavelength of 8-14 µm. Providing any other configurations may also be useful. In other embodiments, the absorber is configured to absorb incident radiation having a wavelength of 2-5 µm. For example, another harmonic of the interferometric absorber is used. In one embodiment, the absorber is configured to absorb >50% of incident radiation having a wavelength of 2-5 µm.

A sensor protection layer 259, in one embodiment, is disposed over the absorber layer. The sensor protection layer serves to protect the sensor from subsequent etch processes. For example, the protection layer serves to protect the line structure and absorber layer from etchants, such as $XeF_2$, used to form the lower sensor cavity. In one embodiment, the protection layer is a silicon oxide layer. Other layers which are transparent to infrared radiation and are selective to the etchant used to form the lower sensor cavity may also be useful.

The surface of the hybrid CMOS component includes a reflector. The reflector reflects infrared radiation. The reflector may be formed from a conductive material. In one embodiment, the reflector is a conductive metal silicide reflector. The metal silicide reflector may be a titanium silicide ($TiSi_x$), a tungsten silicide ($WSi_x$) or an aluminum silicide ($AlSi_x$) reflector. Other types of metal silicide reflectors may also be useful. Alternative types of reflectors may also be useful. For example, the reflector may be a conductive doped reflector layer. The doped reflector layer may be a doped silicon layer, such as a doped polysilicon layer. The doped reflector layer may be heavily doped with p-type or n-type dopants. For example, the dopant concentration of the doped reflector layer may be about $10^{21}$ dopants/cm$^3$. The conductive properties of the surface of the doped region are attributed to the high concentration of dopants being applied, thereby enabling the reflection of the incoming infrared radiation. Other types of infrared reflectors may also be useful. In other embodiments, the reflector may be a non-conductive reflector, such as a photonic crystal reflector.

In one embodiment, the reflector may be integrated as part of the hybrid CMOS component. For example, a conductive reflector, it may also serve as a top portion of a CMOS component, such as top electrode. The electrode may be a conductive layer, such as a doped polysilicon layer or a metal silicided silicon or polysilicon layer. In such cases, the top electrode may also serve as a reflector. In some cases, the top electrode of the hybrid CMOS component may have empty spaces. For example, the top of the hybrid CMOS region may have non-component areas. To improve reflector performance, reflector fillers may be provided to fill non-component areas of the top of the hybrid CMOS region. Preferably, the reflector fillers are formed of the same material as the top electrode of the hybrid CMOS component. Providing reflector fillers which have different materials from the top electrode may also be useful.

In other embodiments, the reflector may be separate from the hybrid CMOS component. A dielectric layer may be provided to isolate the reflector form the hybrid CMOS component in the case of a conductive reflector. In the case of non-conductive reflectors, such as photonic crystals, a dielectric layer may not be needed.

A hybrid component protection layer may be disposed over the reflector. The protection layer serves to protect the hybrid component and/or reflector from subsequent etch processes. For example, the protection layer serves to protect the hybrid component and/or reflector from etchants used to form the lower sensor cavity. In one embodiment, the protection layer is a silicon oxide layer. Other layers which are transparent to infrared radiation and are selective to the etchant used to form the lower sensor cavity may also be useful. The protection layer may be the dielectric layer 283 of the dielectric stack 282.

In one embodiment, the optical distance between the absorber and reflector is selected to optimize reflection of infrared radiation by the reflector. In one embodiment, the optical distance between the absorber and reflector is selected to ensure ¼ wavelength distance between the absorber and reflector. For example, the optical distance may be about 2-3 µm for detecting infrared radiation having a wavelength of 8-12 µm. Other distances may also be useful, depending on the wavelength to be detected. For example, by decreasing or increasing the optical distance, infrared radiation with smaller or larger wavelengths can be detected respectively. The optical distance is defined as the distance where the infrared radiation wave possesses an optical path going through several layers.

A back-end-of-line (BEOL) dielectric layer 270 is provided on the substrate. For example, the BEOL dielectric layer is provided over the CMOS and hybrid regions. The BEOL includes a plurality of inter layer dielectric (ILD) layers 271. An ILD layer includes a via level 272 disposed below a metal level 276. The metal level includes metal lines 277 and the via level includes contacts 273. The metal lines and contacts may be formed using a single or dual damascene process. In the case of a single damascene process, the contacts and metal lines are formed in separate processes. In the case of a dual damascene process, the metal lines and contacts are formed in the same process. In some embodiments, metal lines may be formed using a reactive-ion etching (RIE) process. For example, a metal layer is formed and patterned to form lines. The different ILD layers may employ different processes. For example, one ILD layer may employ single damascene, another may employ dual damascene, and yet another may employ single damascene to form contacts and RIE to form metal lines.

The top metal level of the top ILD layer serves as a pad level. For example, bond openings 279 are provided to expose bond pads. The bond pads provide external access to the internal components of the device. For example, input, output and power signals may be provided via the bond pads.

As shown, the BEOL dielectric layer includes 3 ILD layers which includes metal layers M1, M2 and M3. The metal layer M1 is the bottom metal layer and the metal layer M3 is the top metal layer. Providing other number of ILD layers may also be useful. The numbers may depend on the CMOS process employed. Typically, the first contact level of the first ILD layer is formed using a single damascene process. For example, contacts are formed to couple to various terminals of the components. The contacts may contact S/D regions of the transistors, well contacts, terminals of the hybrid CMOS component and sensor. The first metal level of the first ILD layer may employ a single damascene or RIE process. As for the second level, it may be formed by a dual damascene process. The top contact level may be formed by a single damascene process and the top metal level may be formed by a RIE process. Other processes for forming the various ILD layers may also be useful. As shown, the BEOL dielectric over the lower sensor cavity is removed to expose the sensor. For example, the removal of the BEOL dielectric over the sensor forms an upper sensor or BEOL cavity 264.

In one embodiment, the BEOL cavity includes a tapered stepped shape. As shown, the tapered stepped shape tapers from top inwardly to the bottom, resulting in the top part of the BEOL opening being larger than the bottom part of the BEOL opening. The shape of the stepped BEOL cavity can be formed using the various metal layers having patterned metal lines which serves etch masks to define the shape of the BEOL cavity. In addition, one of the metal layers may also be used to serve as an etch mask for the etch process to release line structure from the membrane. The metal layer which serves as a line structure release etch mask may be M1. Other metal layers may also be useful. For example, in the case M1 is used to form the metal contact of the line structure, M2 may be employed to serve as the release etch mask. The portion of the metal layer used as the release etch mask is removed after the etch process.

A cap 290 is disposed on the substrate, encapsulating the CMOS and hybrid regions. The cap, for example, is bonded to the substrate to form a vacuum over the CMOS and hybrid regions. The cap, in one embodiment, is formed of a material which is transparent to infrared radiation. For example, the cap is capable of transmitting infrared radiation to the sensor. The cap may be a silicon (Si) cap. Other types of materials, such as germanium (Ge), silicon-germanium (SiGe) or zinc sulphide (ZnS), may also be used to form the cap. Providing a cap formed from other types of materials which transmit infrared radiation may also be useful.

In one embodiment, the cap includes an anti-reflective region 291. The anti-reflective region facilitates transmission of infrared radiation through the cap. In one embodiment, the anti-reflective region includes a bottom grating 292 on the inner (bottom) surface of the cap and a top grating 294 on the outer (top) surface of the cap. The gratings can have a moth eye grating pattern or structure to facilitate transmission of infrared radiation. The gratings may have other patterns which facilitate transmission of infrared radiation. The gratings may be formed by etching the surfaces of the cap.

In another embodiment, the anti-reflective region includes anti-reflection coating disposed on the front and back sides of the cap. Materials with different reflective index may be deposited alternatively on the surfaces of the anti-reflective region. For example, materials for the anti-reflection coating may be zinc sulfide (ZnS) or germanium (Ge). Providing any other materials and deposition techniques for the anti-reflective coating may also be useful. The anti-reflective coating may be deposited on the surfaces of the cap and patterned to remain in the anti-reflective region.

In one embodiment, a getter 296 is disposed on the inner surface of the cap. The getter absorbs moisture and outgassing within the encapsulated device. The getter, for example, may be zirconium alloys, titanium (Ti), nickel (Ni), aluminum (Al), barium (Ba) or magnesium (Mg). Other types of getter materials such as rare earth element including cerium (Ce) or lanthanum (La) may also be useful. The getter facilitates maintenance of the vacuum, improving reliability.

In one embodiment, a sealing ring 288 is employed to facilitate bonding the cap to the substrate. The sealing ring, for example, includes a cap sealing ring 289b and a substrate sealing ring 289a. The cap and substrate sealing rings are mated, bonding the cap to the substrate. In one embodiment, the sealing rings may be a metal or metal alloy. The sealing rings may be gold-based sealing rings, such as gold, gold-tin or a combination thereof. Providing other materials and structures for the sealing rings may also be useful. In one embodiment, the sealing rings are mated by thermal compression. Other techniques for bonding the cap to the substrate by forming thermal compression bonds or eutectic bonds may also be useful.

FIGS. 3a-3d show various embodiments of hybrid CMOS components. Simplified cross-sectional views and 3-dimensional views are provided. The simplified cross-sectional views of the hybrid region include the substrate, CMOS component, lower sensor cavity and sensor. As for the 3-dimensional views, they include the substrate and the hybrid CMOS component.

Figure 3A:
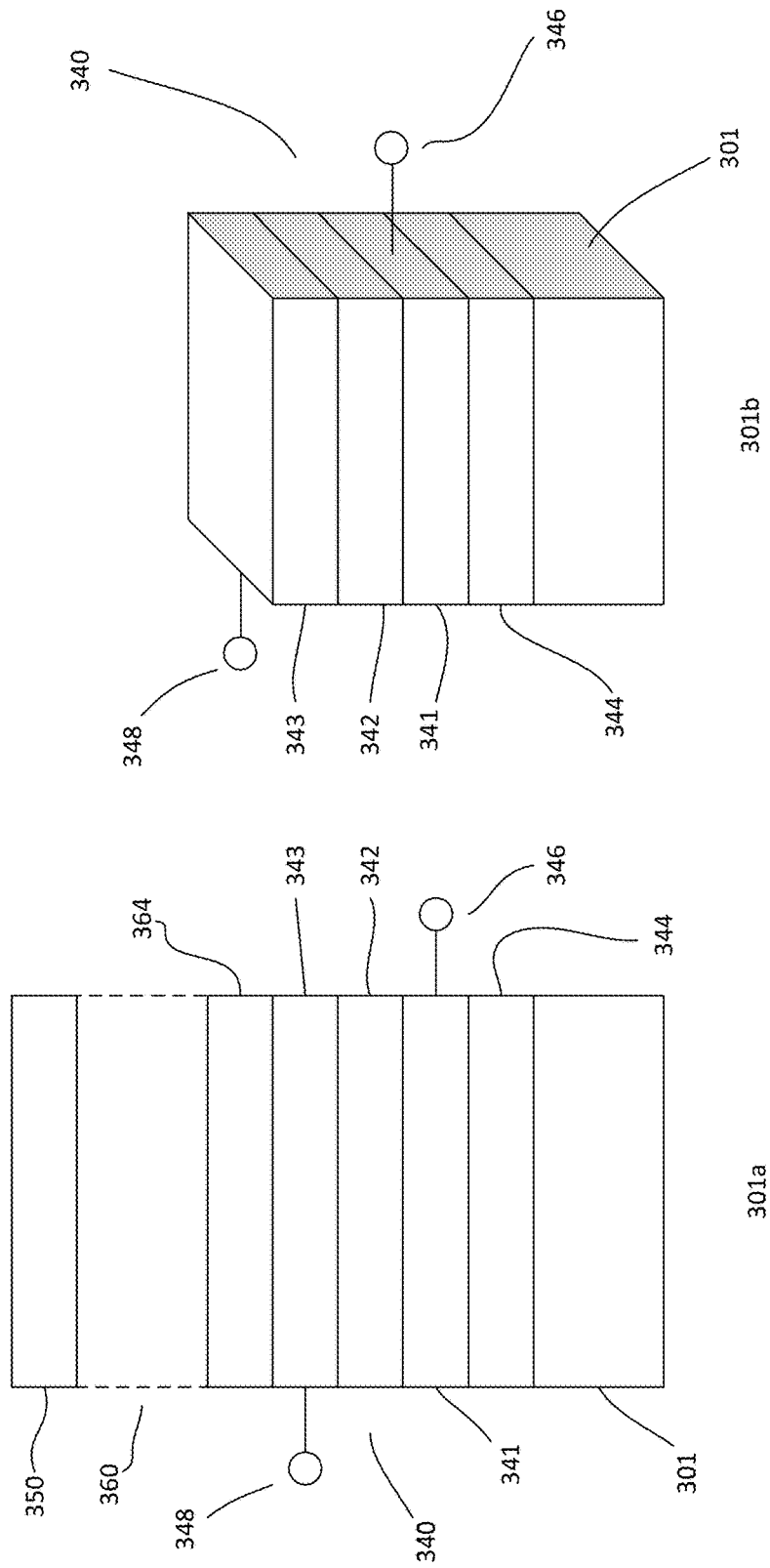
FIGS. 3a-3d show various embodiments of hybrid CMOS components.

Referring to FIG. 3a, simplified cross-sectional view 301a and 3-dimensional view 301b of a hybrid CMOS component are shown. As shown, the hybrid CMOS component is a capacitor 340. The capacitor is disposed on a substrate 301. The substrate, for example, is a silicon substrate. The substrate may be a lightly doped p-type silicon substrate. Other types of semiconductor substrate may also be useful.

In one embodiment, the hybrid region of the substrate includes an isolation well 344. The isolation well, for example, is a doped well. The doped well is doped with isolation dopants. The isolation well isolates the hybrid CMOS component from the substrate. The capacitor includes a bottom capacitor plate or electrode 341. In one embodiment, the bottom electrode is a doped electrode. For example, the substrate is doped with capacitor dopants to form the bottom electrode. In one embodiment, the capacitor dopants and the isolation dopants are opposite polarity type dopants. For example, the capacitor dopants are first polarity type dopants and the isolation dopants are second polarity dopants. The bottom capacitor electrode includes a bottom capacitor terminal 346.

In other embodiments, the bottom capacitor electrode may be a metal silicide bottom electrode. The metal silicide bottom electrode, in one embodiment, is a silicided portion of the substrate on top of the isolation well. The bottom capacitor electrode maybe a Ti, W, or Al based metal silicide bottom capacitor electrode. Other types of metal silicides may also be useful. In the case of a silicided bottom capacitor electrode, the substrate need not be doped with capacitor dopants.

A capacitor dielectric 342 is disposed over the bottom capacitor electrode. The capacitor dielectric may be silicon oxide. A top capacitor plate or electrode 343 is disposed over the capacitor dielectric. The top capacitor electrode may be a doped polysilicon layer. For example, the top capacitor electrode may be polysilicon doped with capacitor dopants. Alternatively, the top capacitor electrode may be a metal silicide electrode. In one embodiment, the top capacitor electrode may be a silicided polysilicon layer on the capacitor dielectric. The polysilicon need not be a doped polysilicon layer. For example, the polysilicon layer may be doped with capacitor dopants or undoped. Other types of electrodes may also be useful. The top capacitor plate includes a top capacitor terminal 348.

As shown, a hybrid CMOS component protection layer 364 is disposed over the top capacitor plate. In one embodiment, the top capacitor plate serves as a reflector for infrared radiation. For example, infrared radiation is reflected back to a thermoelectric sensor 350 separated by a lower sensor cavity 360. Furthermore, as shown, the capacitor terminals are disposed on opposite sides of the capacitor. Providing capacitor terminals which are on the same side or adjacent sides may also be useful. Other configurations of terminals may also be useful.

Figure 3B:
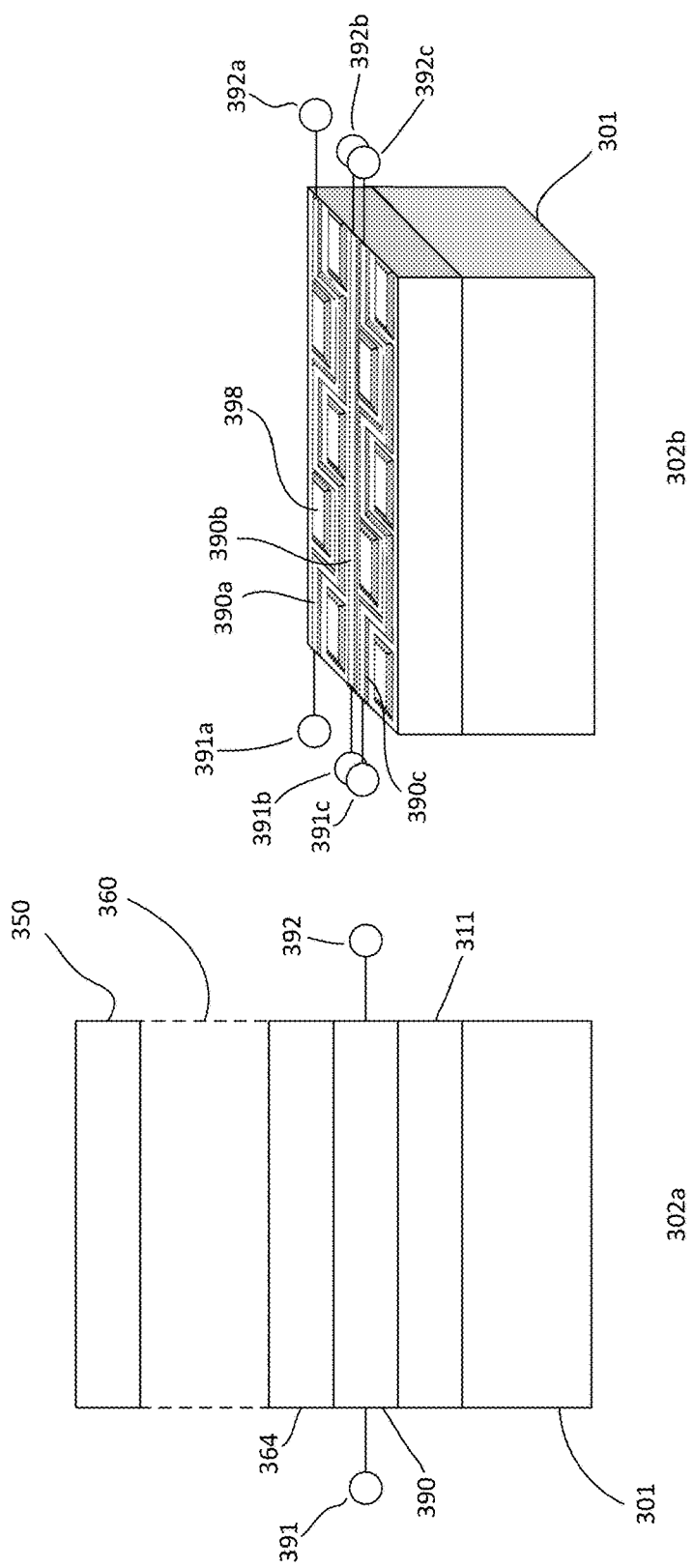

Referring to FIG. 3b, simplified cross-sectional view 302a and 3-dimensional view 302b of a hybrid CMOS component are shown. The hybrid CMOS component may be similar to that described in FIG. 3a. Common elements may not be described or described in detail.

The hybrid CMOS component is a resistor 390. The resistor, as shown, include resistors 390a, 390b and 390c. The resistors, for example, are disposed on a dielectric layer 311 which, in turn, is disposed on a substrate 301. The dielectric layer, for example, is silicon oxide. Other types of dielectric layer may also be useful. The dielectric layer isolates the resistors from the substrate.

In one embodiment, the resistor is a line structure. The line structure may be a polysilicon line structure. For example, the line structure may be a doped polysilicon. The doping concentration may depend on the desired resistance. For example, the line structure is configured to produce the desired resistance. To achieve lower resistance, the line structure may be a silicided line structure. For example, metal silicide may be provided to lower resistivity. In other embodiments, the line structure may serve as an interconnection line or interconnect. The interconnect may be an interconnection line between pixels to facilitate switching from one pixel to another.

A line structure includes first and second ends which serve as first and second terminals 391 and 392. For example, a first resistor includes a first terminal 391a at a first end and a second terminal 392a at a second end. Likewise, the second resistor includes first and second terminals 391b and 392b and the third resistor includes first and second terminals 391c and 392c. The line structure of a resistor may have different shapes. For example, the resistor may have a straight line or a snake-like shape. Other line shapes, such as serpentine, 's' and 'u' shapes may also be useful. It is also understood that the line shapes of different resistors may be different. As shown, the first and third resistors 390a and 390c have snake-like line shapes while the second resistor 390b is a straight line.

The resistor, as discussed, is a line structure which may be doped polysilicon or metal silicide line structure. In the case of doped polysilicon, the doping concentration may be tailored to produce the desire resistance in the resistor line structure. For a line structure which serves as an interconnect, it is a heavily doped polysilicon or metal silicide line structure. The line structure, such as a resistor or an interconnect, may also serve as a reflector. For example, a metal silicide or sufficiently doped polysilicon line structure may serve as reflector. An insufficiently doped line structure may still have reflective properties but may not be highly reflective. As shown, a snake-like shape includes gaps (e.g., non-component areas) without resistor or conductive material. To improve reflector performance, resistor fillers 398 are disposed in the gaps. The fillers are isolated from the line structure. In the case of a doped polysilicon line structure which is insufficiently doped, the fillers may be separately doped with high dopant concentration to serve or improve reflector properties. For example, the fillers may compensate for deficiencies or increase reflective performance in the line structure.

A hybrid CMOS component protection layer 364 is disposed over the resistors and fillers. Infrared radiation is reflected back to a thermoelectric sensor 350 which is separated by a lower sensor cavity 360. The infrared radiation, for example, is reflected by the resistors and fillers. Furthermore, as shown, the resistor terminals are disposed on opposite sides of the resistors. Providing terminals which are on the same side or adjacent sides may also be useful. Other configurations of terminals may also be useful.

Figure 3C:
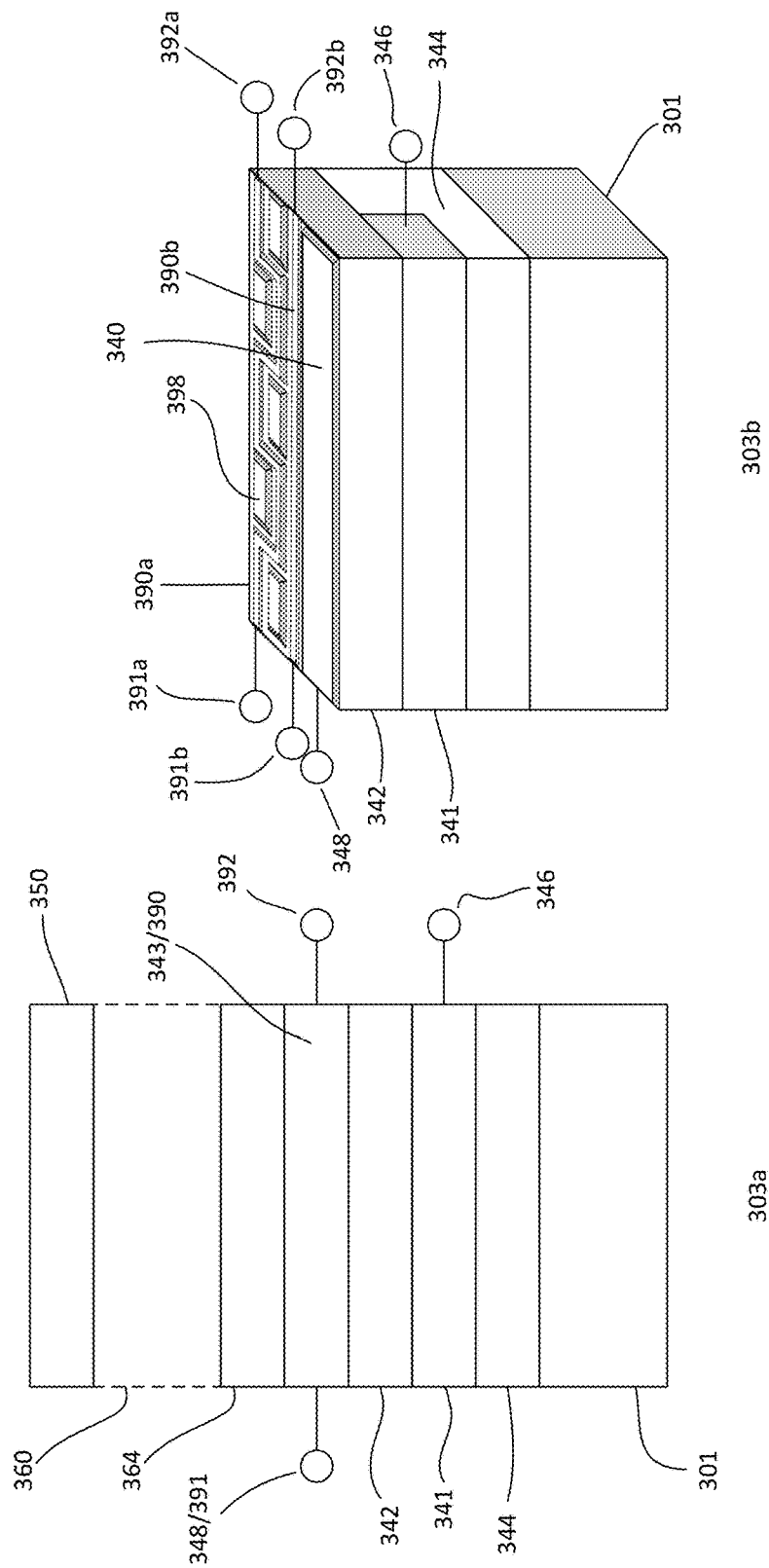

FIG. 3c shows simplified cross-sectional view 303a and 3-dimensional view 303b of a hybrid CMOS component. The hybrid CMOS component is similar that that described in FIGS. 3a-3b. Common elements may not be described or described in detail. As shown, the hybrid CMOS region is segmented to include a capacitor region and a resistor region. The capacitor and resistor regions, for example, may be adjacent regions of the hybrid region. For example, the capacitor and resistor regions extend a length of the hybrid region, each occupying a side. Other configurations of capacitor and resistor regions may also be useful. The capacitor region includes a capacitor 340 and the resistor region includes a resistor 390. In one embodiment, the resistor region includes first and second resistors 390a and 390b. The substrate, such as a silicon substrate, may include an isolation well 344. The isolation well occupies the hybrid region. A bottom capacitor plate 341 is disposed in the isolation well in the capacitor region. The bottom capacitor plate, for example, is a doped capacitor plate. In other embodiments, the bottom capacitor plate may be a metal silicide capacitor plate formed on the substrate over the isolation well.

A capacitor dielectric 342 is disposed over the bottom capacitor plate. The capacitor dielectric, for example, occupies both the capacitor and resistor regions. The capacitor dielectric in the region isolates the resistors from the substrate. A top capacitor plate 343 and first and second resistors are disposed over the capacitor dielectric. For example, the top capacitor plate is disposed in the capacitor region and the resistors are disposed in the resistor region. The top capacitor plate may be a doped polysilicon or a metal silicide capacitor plate.

As previously discussed, a resistor may be a line structure. For example, the first resistor may be a first line structure and the second resistor may be a second line structure. The line structures may be doped polysilicon line structures. The dopant concentration of the line structures may be tailored to achieve the resistance. The first and second line structures need not have the same doping concentration. In some embodiment, a line structure may be configured as an interconnect. For example, an interconnect line structure may be a heavily doped line structure or silicided polysilicon line structure to serve as an interconnect. Additionally, fillers may be provided in the resistor region. The fillers may be doped polysilicon or metal silicide fillers. For doped polysilicon fillers, it may have the same or different dopant concentration than the line structures. As such, the different structures or features need not be of the same material or same dopant concentration. For example, the features may have any combination of doped polysilicon and metal silicide features.

In one embodiment, the first resistor is a snake-shaped line structure while the second resistor is a straight line structure. For example, the first line structure is a doped polysilicon line structure to serve as a resistor while the second line structure may be a heavily doped polysilicon or metal silicide line structure to serve as an interconnect. Fillers 398 are provided in the resistor region to improve reflector performance. The fillers may be heavily doped polysilicon or metal silicide fillers. Other configurations of line structures in the resistor region may also be useful.

As discussed, the top capacitor electrode may be a heavily doped polysilicon or metal silicide top capacitor electrode. As for the line structures and fillers, they may be doped polysilicon and/or metal silicide. The different features which form the top of the hybrid CMOS region, such as top capacitor electrodes, line structures and fillers, may serve as a reflector. The different features may also be formed of any combination of doped polysilicon and metal silicide. For example, the reflector may be formed of different reflector materials. In other embodiments, the reflector is separate from the hybrid CMOS components. For example, an insulator layer may be disposed between the hybrid CMOS components and the reflector.

A hybrid CMOS component protection layer 364 is disposed over the capacitor, resistors and fillers. Infrared radiation is reflected back to a thermoelectric sensor 350 which is separated by a lower sensor cavity 360. The infrared radiation, for example, is reflected by the top capacitor plate, resistors and fillers. Furthermore, as shown, the capacitor and resistor terminals are disposed on opposite sides of the capacitor and resistors. Providing terminals which are on the same side or adjacent sides may also be useful. Other configurations of terminals may also be useful.

Figure 3D:
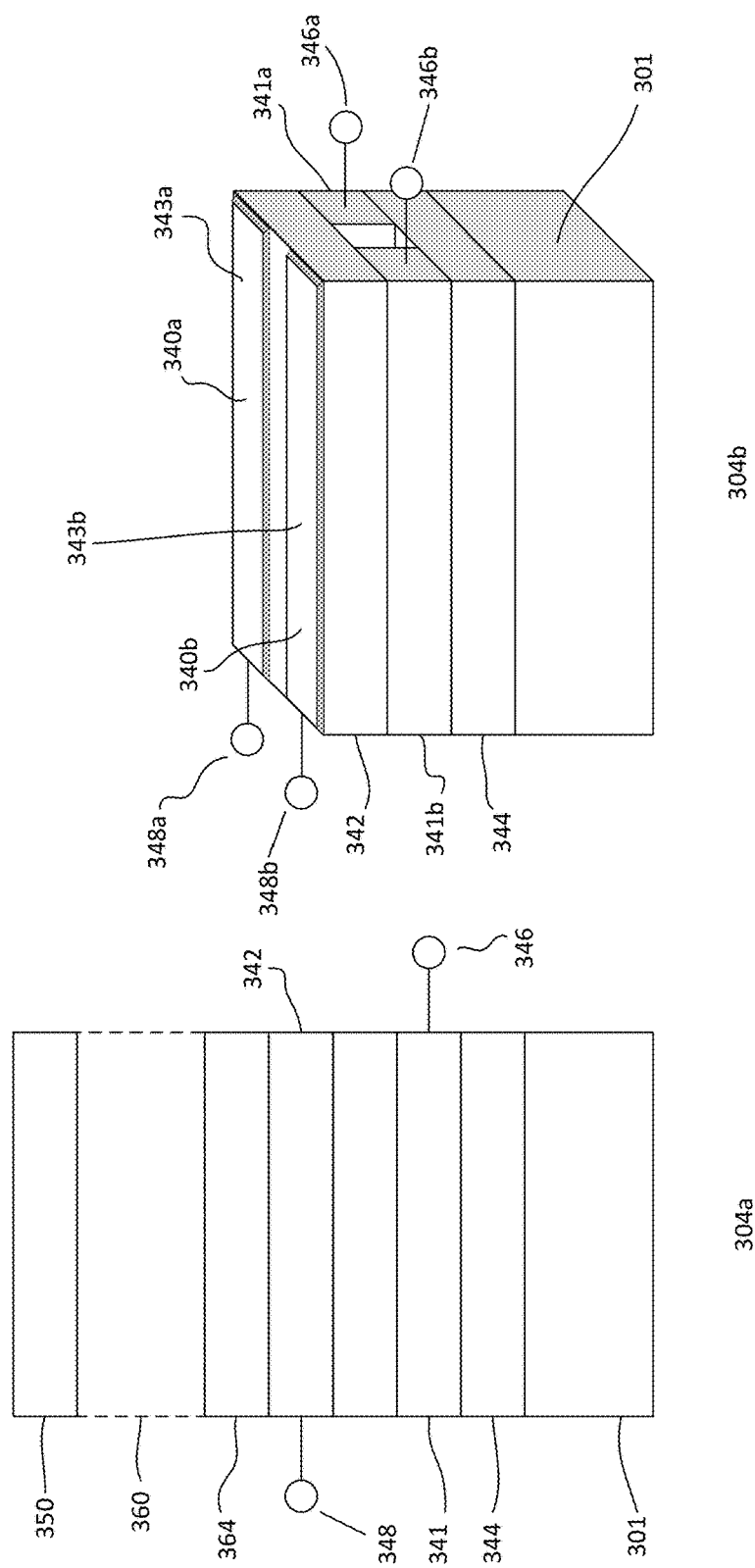

FIG. 3d shows simplified cross-sectional view 304a and 3-dimensional view 304b of a hybrid CMOS component. The hybrid CMOS component is similar to that described in FIGS. 3a-3c. Common elements may not be described or described in detail. As shown, the hybrid CMOS region is segmented to include first and second capacitor regions. For example, the first and second capacitor regions include first and second capacitors 340a and 340b. The capacitor regions, for example, may be adjacent regions of the hybrid region. For example, the capacitor regions extend a length of the hybrid region, each occupying a side. Other configurations of capacitor regions may also be useful.

First and second bottom electrodes are formed in the first and second capacitor regions of an isolation well 344 of a substrate 301. The bottom capacitor plates, for example, are isolated from each other as well as the substrate by the isolation well. The bottom capacitor plates, for example, are doped capacitor plates. In other embodiments, the bottom capacitor plates may be metal silicide capacitor plates.

A capacitor dielectric 342 is disposed over the bottom capacitor plates. The capacitor dielectric, for example, occupies both the capacitor regions. First and second top capacitor plates 343a and 343b are disposed over the capacitor dielectric. For example, the first top capacitor plate is disposed in the first capacitor region and the second top capacitor plate is disposed in the second capacitor region. The top capacitor plates may be doped polysilicon. Alternatively, the top capacitor plates may be metal silicide plates.

A hybrid CMOS component protection layer 364 is disposed over the capacitors. Infrared radiation is reflected back to a thermoelectric sensor 350 which is separated by a lower sensor cavity 360. The infrared radiation, for example, is reflected by the top capacitor plates. Furthermore, as shown, the capacitor terminals are disposed on opposite sides of the capacitors. Providing terminals which are on the same side or adjacent sides may also be useful. Other configurations of terminals may also be useful.

As discussed, the hybrid CMOS components may be passive CMOS components such as capacitors, resistors or conductive lines, or a combination thereof. In the case of capacitors, they may be used to store charges generated by the thermopile. The capacitors may also serve other purposes, such as capacitors for amplifier circuitry to amplify signal of the thermopile sensor or as filter capacitors. In addition, capacitors may be interconnected to provide a high capacitance capacitor. High capacitance capacitor may be employed to increase performance of column amplifiers. As for resistors, they may serve as filters. For example, low pass filters may be formed by high resistance resistors. Using meander shapes for resistors can lead to high resistance. In some embodiments, a conductive line may serve as a row line (RL). The ability to dispose hybrid CMOS components within the lower sensor cavity under the sensor increases fill factor of the device, enhancing integration with reduced chip size.

Figure 4A:
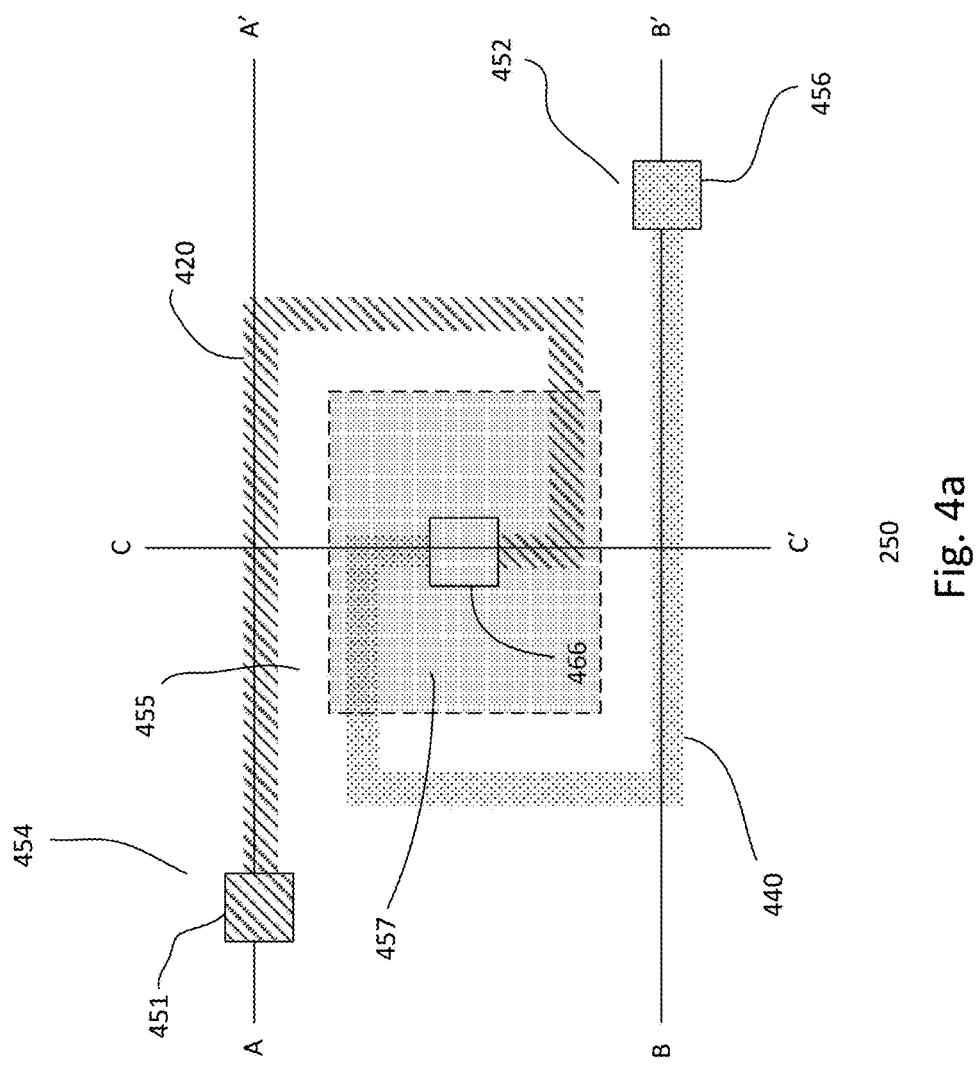
Figure 4B:
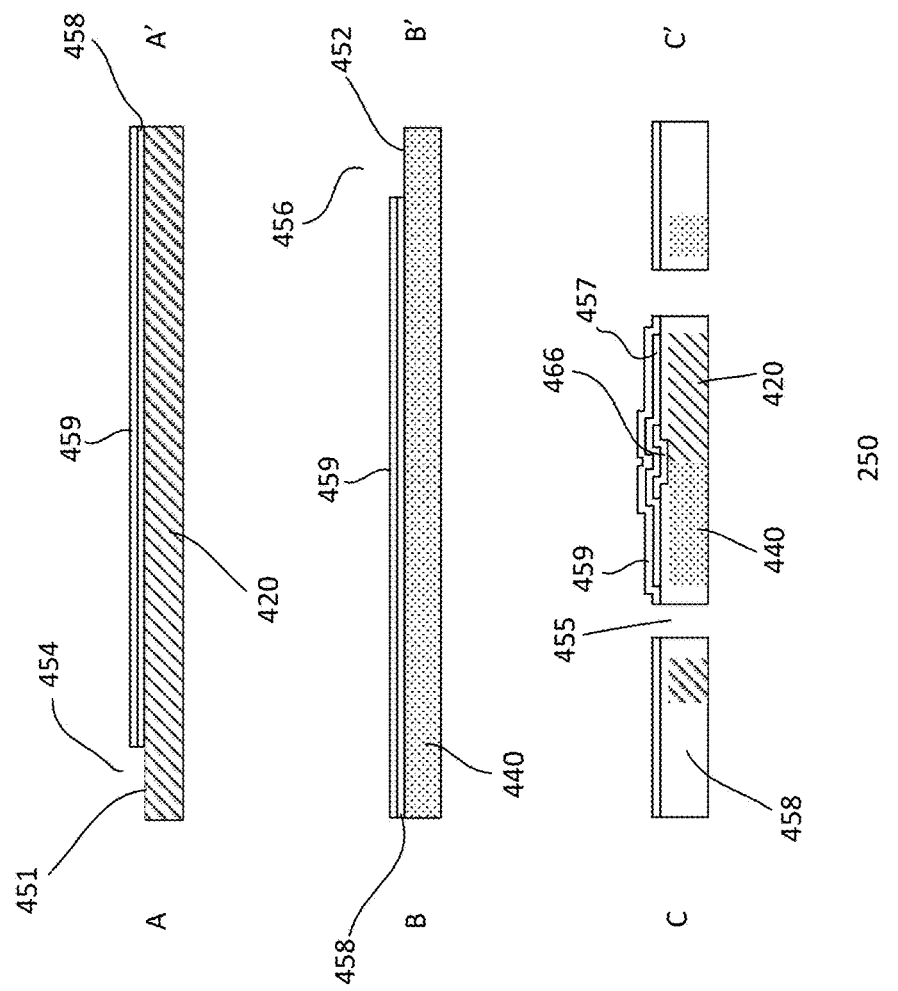

FIG. 4a shows a simplified top view of an embodiment of a MEMS structure 250 and FIG. 4b shows various cross-sectional views of the MEMS structure along A-A', B-B' and C-C'. The top view excludes the protective layer 459. The MEMS structure is a line structure. The line structure is a thermopile which serves as a thermoelectric infrared sensor or detector. The line structure is disposed on the membrane or dielectric layer which structures the lower sensor cavity. The line structure, in one embodiment, includes a single line unit (N=1) which has a meandering shape and occupies the surface of the membrane.

In one embodiment, the line unit includes polysilicon. Other types of line units may also be useful. For example, thermopile materials which are stable under high temperatures may be employed to form the line structures. Such materials may, for example, include SiGe, GaN and 2D materials, such as graphene, black phosphorus or molysulfide.

The line unit includes first and second line segments 420 and 440. A first end 451 is part of the first line segment and a second end 452 is part of the second line segment. A first line structure terminal 454 is disposed at the first end and a second line structure terminal 456 is disposed at the second end. The terminals, for example, are part of the line unit of the line structure. The terminals serve as terminals of the MEMS structure or sensor.

In one embodiment, the first line segment is doped with a first polarity type dopant and the second line segment is doped with second polarity type dopants. For example, the first line segment is heavily doped with first polarity type dopants and the second line segment is heavily doped with second polarity type dopants. The first polarity type may be p-type and the second polarity type may be n-type. Providing first polarity type which is n-type and second polarity type which is p-type may also be useful. The doping may be integrated into the S/D or contact doping. Doping the segments separate from the S/D or contact doping may also be useful.

The line structure may be patterned using mask and etch techniques. For example, a photoresist is disposed on a line structure layer. The photoresist may be exposed by an exposure source through a reticle containing the desired pattern of the line structure. After development, the pattern of the reticle is transferred to the photoresist to form an etch mask. An etch is employed to pattern the line structure layer to form the line structure. The etch mask, for example, may be a photoresist mask. The etch, for example, is an anisotropic etch, such as a reactive ion etch (RIE). Other etch processes may also be useful. In one embodiment, the etch forms the line structure with the first and second segments. In one embodiment, the line structure is a continuous line structure with first and second line segments. Alternatively, the line structure may be a non-continuous line structure having, for example, first and second segments. The first and second segments may be electrically connected by a metal contact. If the line structure is integrated into the gate electrode layer, the mask used to pattern the gates may be used to pattern the line structure. Alternatively, separate masks and etch processes may be used to pattern the gates and the line structure.

As shown, the segments are mirror images of each other. This produces line segments which are about the same length. By providing a meandering design for the line segments, efficient use of the hybrid region can be achieved while producing a line structure having the desired resistance. For example, the line structure produces a resistance of about 5-50 kΩ. Other resistance may also be useful.

To dope the first and second line segments, separate implants may be used. For example, a first implant using a first implant mask is used to dope the first line segment and a second implant using a second implant mask is used to dope the second line segment. In the case the doping of the line segments is integrated into the S/D implants, the masks may be those used for p-type and n-type S/D implants.

A line dielectric layer 458 covers the line structure, filling the gaps. The line dielectric layer provides mechanical support for the thermopile membrane. The line dielectric layer may be a self-planarizing dielectric layer, such as spin-on-glass (SOG). Other types of self-planarizing dielectric materials may also be useful. The dielectric layer may have a top surface which is about 100-400 nm above the top of the line structure. Providing a dielectric layer having other thicknesses over the top of the line structure may also be useful.

A contact 466 is provided to electrically couple the first and second line segments. The contact, for example, is a metal contact, such as titanium (Ti) or aluminum (Al). Other types of contacts may also be useful. To form the contact, a contact opening is formed in the dielectric layer to expose the line structure at about the junction of the first and second segments. A metal layer is formed on the substrate and patterned, leaving the contact coupling the first and second segments. The metal layer, for example, may be titanium (Ti) or aluminum (Al) formed by sputtering or plating. Other types of metal layers or forming techniques may also be useful. In other embodiments, the contact may be formed by damascene technique. For example, a via opening is formed in the dielectric layer. A conductive layer is formed, filling the via opening and covering the dielectric layer. A planarizing process, such as CMP, is performed to form the metal contact in the via opening, connecting the first and second segments of the line structure.

An absorber layer 457 is formed on the substrate, covering the dielectric layer. The absorber layer may be patterned using etch and mask processes to be disposed in the hybrid region over the line structure. In one embodiment, the absorber layer is patterned, covering a central portion of the line structure and contact, leaving the leg portions outside the central portion exposed. The absorber layer, for example, absorbs infrared radiation. The absorber layer may be a TiN or NiCr layer. The absorber layer, for example, may be formed by sputtering. Other types of absorber layers may also be useful. In one embodiment, the absorber is configured to absorb most of the infrared radiation. For example, the absorber may be configured to absorb greater than 85% of infrared radiation having a wavelength of 8-14 μm. Absorbing other wavelengths may also be useful. As shown, the absorber layer is disposed over the contact. The absorber serves as a hot junction of the thermopile. The leg portions of the line structure uncovered by the absorber serves as the cold junction if the thermopile.

A protective layer 459 may be provided. The protective layer, for example, covers the MEMS structure. The protective layer protects the MEMS structure from subsequent processes. The protective layer, for example, is a silicon oxide layer formed by CVD. Other types of protective layers may also be useful. The protective layer may be a dielectric layer between a metal layer and the metal contact. For example, the protective layer may be a dielectric layer between M1 (contact) and M2. Other configurations of metal layers and the protective layer may also be useful.

The protective layer, line dielectric layer and membrane forming the top of the lower sensor cavity are patterned to form openings 455, separating the legs from the central portion of the line structure. The openings provide access to the lower sensor cavity. This enables removal of the sacrificial fill in the lower sensor cavity, releasing the line structure. In one embodiment, one of the metal layers in the BEOL dielectric may be patterned to serve as a line structure release etch mask for patterning the various layers to form openings 355 to release the line structure. For example, the metal layer may be M1 or M2. Other metal layers may also be used to serve as an etch mask for the release etch process.

Figure 4D:
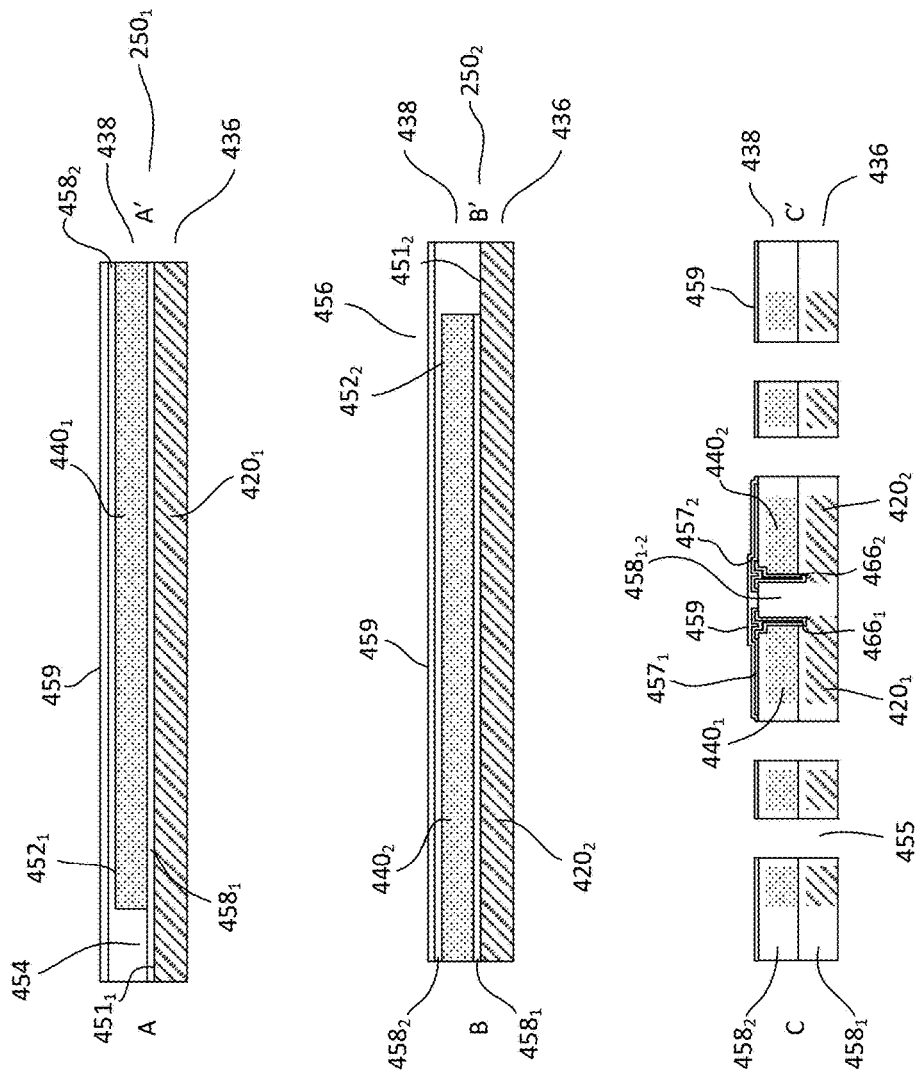

FIG. 4c shows a top view of another embodiment a MEMS structure 250 and FIG. 4d shows cross-sectional views of the MEMS structure based on the top view of the MEMS structure of FIG. 3c. The cross-sectional views are along A-A', B-B' and C-C'. The MEMS structure is a line structure forming a thermopile which serves as a thermoelectric infrared sensor. The top view excludes the protective layer protecting the line structure. The line structure is similar to that described in FIGS. 4a-4b. Common elements may not be described or described in detail. The line structure is disposed on the membrane which structures the lower sensor cavity.

The line structure has more meanderings or turns to increase the length of the segments which occupies the surface of the membrane as compared to FIGS. 3a-3b. This increases the resistance of the line structure. Other designs for the line segments to increase length or to tailor the lengths of the segments to achieve the desired resistance may also be useful.

In one embodiment, the MEMS structure is a multi-line unit line structure with N number of line units that are coupled in series to form a thermoelectric infrared sensor. As shown, the MEMS structure includes first and second line units $250_1$ and $250_2$ (e.g., N=2). Providing other number of line units for the multi-line unit line structure may also be useful. For example, a multi-line unit line structure may have 2-4 (N=2-4) line units. Preferably, a multi-line unit line structure has $N^2$ line units. Preferably, N is equal to 1-2. Other number of line units may also be useful.

As discussed, the line structure shown includes first and second line units ($N^2$ where N=1). In one embodiment, a line unit of the multi-line unit line structure is a stacked line unit. The first and second stacked line units may be disposed adjacent to each other on the dielectric layer within the sensor region. As shown, a center of the sensor region serves as contact regions for the first and second contacts $466_1$ and $466_2$ of the first and second line units $250_1$ and $250_2$. The line units at the contact region are separated by dielectric layers $458_{1-2}$.

A stacked line unit includes a first segment ($420_1$ or $420_2$) disposed in a first line level 436 and a second line segment ($440_1$ or $440_2$) disposed in a second line level 438. The first and second line levels may be separated by a first dielectric layer $458_1$. For example, the second line segment of a line unit in the second line level is overlaid over the first line segment of the line unit in the first line level. The first and second line segments of a line unit are separated by the first interline level dielectric layer $458_1$. The gaps of the line segments are filled by the first and second interline level dielectric layers $458_{1-2}$.

A contact ($466_1$ or $466_2$) connects the first line segment in the first line level to the second line segment in the second line segment. The first and second contacts are formed in the first and second interline level dielectric layers. For example, the contacts are disposed in contact vias. A contact via for a line unit, for example, may overlap the first and second line segments, exposing them. A contact, such as Ti or Al, lines the contact via, connecting the exposed first and second line segments.

In one embodiment, the first line segments of the line units are doped with first polarity type dopants and the second line segments of the line units are doped with second polarity type dopants. For example, the first segments of the line units in the first are doped with first polarity type dopants and the second segments of the line units in the second level are doped with second polarity type dopants. The first polarity type may be n-type and the second polarity type may be p-type. Other configurations of doped line segments may also be useful.

As shown, the first line unit has first and second ends $451_1$ and $452_1$ which are located at a diagonally opposite corner of the sensor region than the first and second ends $451_2$ and $452_2$ of the second line unit. The line units each meander throughout the sensor region from opposite diagonal corners towards the contact region. Other configurations of or meandering patterns for the line units may also be useful. For example, the first stacked line unit may occupy about one half the sensor region and the second stacked line unit may occupy about the other half of the sensor region.

First and second absorber layers $457_1$ and $457_2$ are disposed on the substrate over the second line dielectric layer $458_2$. As shown, the layers cover a central portion of the sensor region, including the contact regions of the first and second contacts. For example, the first absorber covers the central portion of the sensor region and first contact region of the first line unit and the second absorber covers the central portion of the sensor region and the second contact region. The first and second absorber layers, since they are conductive, are distinct absorber layers.

The absorber layers, for example, absorb infrared radiation. The absorber layers may be TiN or NiCr layers. Other types of absorber layers may also be useful. In one embodiment, the absorber is configured to absorb most of the infrared radiation. For example, the absorber may be configured to absorb greater than 85% of infrared radiation having a wavelength of 8-14 μm. Absorbing other wavelengths may also be useful. As shown, the absorber layer is disposed over the contact. The absorber serves as a hot junction of the thermopile. The leg portions of the line structure uncovered by the absorber serves as the cold junction if the thermopile. The process for forming the stacked line structure may include, for example, forming a first line segment layer on the substrate, including in the sensor region over the sensor membrane dielectric layer over the lower sensor cavity. In one embodiment, a polysilicon layer is formed on the substrate by CVD. The first line segment layer is patterned to form distinct first line segments $420_1$ and $420_2$ of the first and second line units. Patterning may be achieved using mask and etch techniques, such as a resist mask and RIE. The first segments may be doped with first polarity type dopants, such as n-type dopants. Doping the segments may be achieve by selectively implanting first polarity type dopants using an implant mask. A first interlevel line dielectric layer $458_1$ may be formed on the substrate. The first interlevel dielectric layer lines the line segments and surface of the sensor membrane layer. The first interlevel dielectric layer, for example, lines the line segments without filling the gaps therebetween. The first interlevel dielectric layer may be a silicon oxide layer formed by CVD. Providing a SOG dielectric layer may also be useful.

A second line segment layer, such as polysilicon is formed on the first interlevel line dielectric layer by CVD and patterned to form distinct second line segments $440_1$ and $440_2$ of the first and second line units using mask and etch techniques. The second line segments, for example, overlaid the first line segments and separated by the first interlevel line dielectric layer. The second line segments are doped with second polarity type dopants, such as p-type dopants. The second line segments may be doped by implanting second polarity type dopants using an implant mask.

A second interlevel line dielectric liner $458_2$ is formed on the substrate. In one embodiment, the second interlevel line dielectric layer may be a SOG layer, filling the gaps and forming a planar top surface over the second line segments. First and second contact vias are formed in the interlevel line dielectric layers in the contact region. The first contact via exposes first and second segments of the first line unit and the second contact via exposes the first and second segments of the second line unit. The contact vias may be formed by mask and etch techniques. A contact layer, such as Ti or Al is deposited on the substrate. Other types of metal contact layers may also be useful. The contact layer, for example, may be deposited by sputtering and lines the second interlevel line dielectric layer and contact vias. In one embodiment, the contact layer lines the contact vias without filling them. The contact layer is patterned by mask and etch techniques to form first and second contacts $466_1$ and $466_2$ of the first and second line units. In other embodiment, a metal contact may be formed, filling the via openings. A polishing process, such as CMP, may be performed to remove excess metal material, leaving contacts in the contact vias.

An absorber layer is formed on the substrate, covering the second interlevel line dielectric layer and contacts. The absorber layer, for example, is a conductive layer formed by sputtering. The absorber layer is patterned to form distinct first and second absorber layers $457_1$ and $457_2$ in the central portion of the sensor region using mask and etch techniques. In the case the contacts lines the vias without filling them, the absorber layer may serve to fill the contact vias over the contacts.

A protective layer 459 may be provided. The protective layer, for example, covers the MEMS structure. The protective layer protects the MEMS structure from subsequent processes. The protective layer, for example, is a silicon oxide layer formed by CVD. Other types of protective layers may also be useful.

The protective layer, line dielectric layer and membrane forming the top of the lower sensor cavity are patterned to form openings 455, separating the legs from the central portion of the line structure. For example, a patterning process is performed to release the line units of the line structure. The openings provide access to the lower sensor cavity. This enables removal of the sacrificial fill in the lower sensor cavity, releasing the line structure. The mask of the patterning process, in one embodiment, may be served by a metal layer of the BEOL dielectric. For example, the mask may be served by M1 or M2 of the BEOL dielectric. In other embodiments, the mask may be a patterned resist mask.

As discussed, the first and second line units $250_1$ and $250_2$ are coupled in series. In one embodiment, the second end $452_1$ of the first line unit is coupled to the first end $451_2$ of the second line unit. The series connection in the line unit may be facilitated by via contacts in the interlevel line dielectric layers which are coupled to the second end of the first line unit and the first end of the second line unit. A metal line may be provided in the BEOL dielectric layer, such as in M1, to connect the via contacts. Other configurations of providing series connection of the line units may also be useful.

As described, the line segments of the line units are disposed in the same line level and are doped with the same dopant type. This allows the line segments of the line units to be doped using a single implant process (e.g., same implant process using a single implant mask). In alternative embodiments, the line segments of the line units in the same line level may be doped with opposite polarity type dopants. In such cases, the line segments are doped by separate implant processes (e.g., different implant processes using different implant masks). As such, providing line segments of the line units which have the same doping type in the same line level reduces the need to use additional implant masks. Other configurations of line segments for the line units may also be useful.

As described, the MEMS structure includes 2 line units which are stacked and coupled in series. Providing other numbers of stacked line units which are coupled in series may also be useful. Preferably, the line segments of the stacked line units have similar designs. However, it is understood that this is not necessary. In addition, the line structures may have layouts other than that described in FIGS. 4a-4d.

Figure 4E:
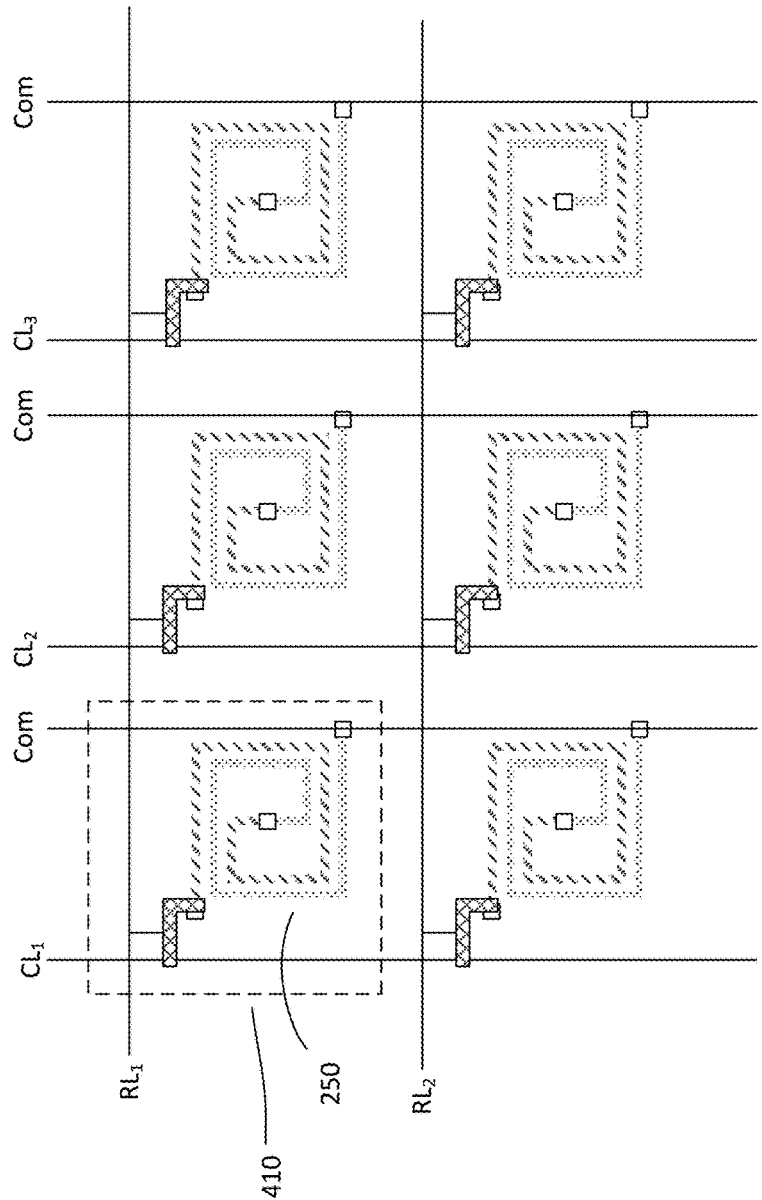
FIG. 4e shows a sensor array.

FIG. 4e shows a sensor array 404. The sensor array includes a plurality of sensor cells 410. A sensor cell includes a switch coupled to a MEMS structure, such as a line structure or structures as described in FIGS. 4a-4d. Common element may not be described or described in detail.

The sensor cells are configured to form an array having Y rows and Z columns. A sensor cell corresponds to a pixel of the sensor array. The sensor cells are coupled in a row direction by row lines ($RL_m$) and in the column direction by column lines ($CL_n$). A sensor cell may correspond to a pixel. Additionally, common lines (Coms) are also used to couple the sensor cells in each column. For example, each column of sensors is coupled to a respective Com (e.g., $Com_1$, $Com_2$ or $Com_3$). As shown, the array includes a 2×3 array (Y=2 and Z=3). For example, the sensor cells are arranged in 2 rows ($RL_1$ and $RL_2$) and 3 columns ($CL_1$, $CL_2$ and $CL_3$). Other sized arrays may also be useful. For example, the sensor array may be a 32×32 or 80×62 array.

The pixels of the sensor array may include a plurality of sensors arranged in a matrix on the substrate. For example, each pixel may include a sensor region and a CMOS switching or connection region. The hybrid CMOS regions are disposed in, for example, a sensor array region of the substrate. For example, the array region includes a plurality of hybrid sensor regions corresponding to sensor pixels.

In one embodiment, a first terminal of the MEMS structure of the sensor cell is coupled to the switch while a second terminal is coupled to a common line (Com). As shown, each column of sensor cells is couple to a respective Com (e.g., $Com_1$, $Com_2$, and $Com_3$). A switch may be a transistor having first and second S/D terminals and a gate or control terminal. For example, a first S/D terminal of the switch is coupled to the first terminal of the MEMS structure and the second S/D terminal is coupled to a CL. The RL is coupled to a gate or control terminal of the switch. In one embodiment, the n-type terminal of the sensor cell is coupled to Com and the p-type terminal of the sensor cell is coupled to CL. Other configurations of coupling the sensor cell to CL and Com may also be useful. A RL can be selected to select a row of sensor cells. A CL is activated to select a column of sensor cells. The selected cell is the intersection of the selected RL and selected CL. The selected cell outputs the information to be read. The interconnections between the CMOS components and sensor pixels may be achieved through the ILD layers of the BEOL dielectric.

In one embodiment, the sensor array is configured to read out a row of sensor cells or pixels. For example, the pixels of the array are read out one row at a time. In one embodiment, a RL of the array is selected. This selects a row of pixels. CLs are then selecting, causing the pixels of the selected RL to be read out. In one embodiment, the array is configured to read out one row of pixels at a time, starting from the first row to the last. The information read out are stored in memory. An image or one frame of the imager will be produced once all pixels are read out or once all rows have been scanned through. For example, information stored in memory read out form the pixels may be reconstructed to form an image.

In the case of the 2×3 array shown in FIG. 4e, scanning the pixels to form an image may include selecting $RL_1$ (the first row) to select the pixels coupled to $RL_1$. After $RL_1$ is selected, $CL_1$, $CL_2$ and $CL_3$ are selected, causing the pixels coupled to $RL_1$ to be read out. The information of the pixels coupled to $RL_1$ are stored in memory. The next or second row $RL_2$ is selected to select the pixels of $RL_2$. After $RL_2$ is selected, $CL_1$, $CL_2$ and $CL_3$ are selected, causing the pixels coupled to $RL_2$ to be read out. The information of the pixels coupled to $RL_2$ are stored in memory. Since $RL_2$ is the final row of the array, the information of the pixels is reconstructed to form an image or a frame of the imager. Numerous frames may be collected by repeating the sensing, read out and reconstruction process. For example, an image or a frame is time-dependent.

Select logic and output logic components may be employed to select the cell for outputting information contained. The logic components may be CMOS transistors or components in the CMOS region of the device. Other logic components, including memory and reconstruction logic components, may be included to store and reconstruct information to form an image or images. In one embodiment, the memory and reconstruction logic components may be off-chip logic. Providing these logic components as on-chip logic components or a combination of on-chip or off-chip components may also be useful.

FIGS. 5a-5g show cross-sectional views of an embodiment of a process for forming a device 500. The device, for example, is similar to that described in FIG. 2, FIGS. 3a-3d and FIGS. 4a-4e. Common elements may not be described or described in detail.

Referring to FIG. 5a, a substrate 501 is provided. The substrate, for example, may be a semiconductor substrate, such as a silicon substrate. Other types of substrates or wafers may also be useful. For example, the substrate may be a silicon germanium, germanium, a gallium arsenide, or a crystal-on-insulator (COI) such as silicon-on-insulator (SOI) substrate. The substrate maybe a doped substrate. For example, the substrate can be lightly doped with p-type dopants. Providing a substrate with other types of dopants or dopant concentrations, as well as an undoped substrate, may also be useful.

The substrate, as shown, is prepared with first and second device regions 504 and 506. The first region is a CMOS region while the second region is a hybrid region. The CMOS region is configured to include CMOS components and the hybrid region is configured to include a MEMS and hybrid CMOS components.

Front-end-of-line (FEOL) processing is performed on the substrate. For example, the CMOS region of the substrate is processed to include first and second transistor regions 520a and 520b. The hybrid region may be processed to include a hybrid CMOS component region. In one embodiment, first and second transistor wells 521 are formed in the first and second transistor regions and an isolation well 544 is formed in the hybrid CMOS component region. For example, the first transistor well is a p-type well for a n-type MOS transistor, the second transistor well is a n-type well for a p-type transistor and the isolation well may be for a capacitor. The isolation well is doped with isolation type dopants. The wells, for example, may be formed by ion implantation using an implant mask. The implant mask may be, for example, a photoresist implant mask patterned to provide openings for implant regions. Separate implant processes are employed for forming p-type and n-type wells.

As shown, isolation regions 580 are formed on the substrate to isolate the different regions of the substrate. The isolation regions, for example, may also be provided for well contact regions. The isolation regions, for example, are field oxide (FOX) isolation regions. The FOX regions, for example, may be formed by selective thermal oxidation of the substrate using, for example, a nitride mask. Other types of isolation regions may also be useful. For example, the isolation regions may be shallow trench isolation (STI) regions. The STI regions, for example, are trenches formed in the substrate prior to implantation which are filled with dielectric material, such as silicon oxide. The STI regions may have a coplanar top surface with the substrate produced by CMP. In one embodiment, the STI regions are formed prior to dopants implantation so as not to be influenced their growth by the doping of the silicon.

In one embodiment, the hybrid region is processed to form a bottom capacitor electrode. The bottom capacitor electrode, for example, is a doped electrode. The bottom electrode is doped with capacitor dopants. The capacitor dopants and isolation dopants are opposite polarity type dopants. The bottom electrode may be formed by an implant which implants capacitor dopants into the hybrid region of the substrate. Alternatively, the bottom capacitor electrode may be a metal silicide electrode. For example, a metal layer may be deposited on the substrate and patterned to form a metal layer on the substrate corresponding to the electrode. The substrate may be annealed to form the metal silicide bottom electrode. Other techniques for forming the bottom electrode may also be useful.

The CMOS region is shown with first and second type transistors for purpose of simplification. It is understood that the CMOS region may include other transistors and device regions, such as those for different voltage transistors and memory regions.

Figure 5B:
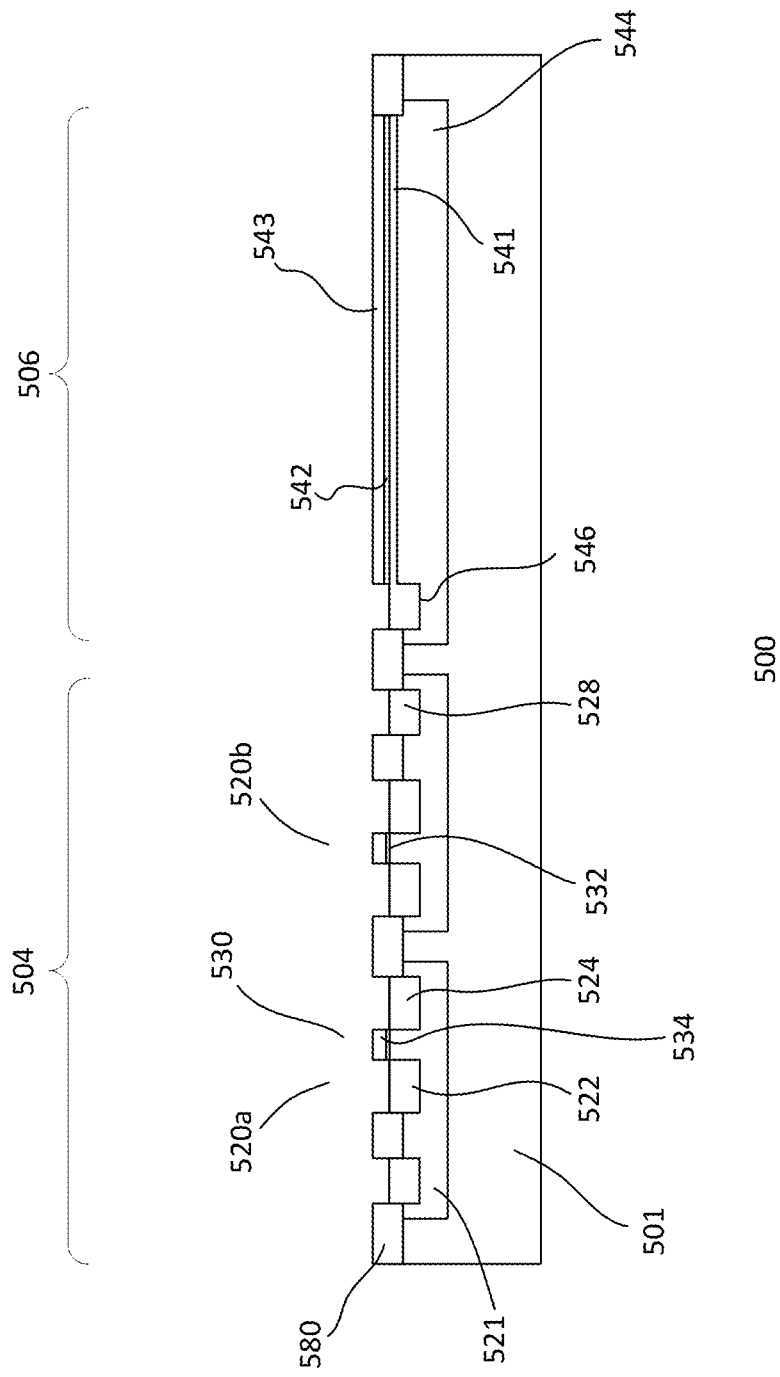

As shown in FIG. 5b, FEOL processing continues. For example, gate layers are formed on the substrate. In one embodiment, the gate layer includes a gate dielectric layer and a gate electrode layer. The gate dielectric layer, for example, is a thermal oxide layer while the gate electrode layer may be a polysilicon layer. The gate electrode layer, for example, may be formed by CVD. In one embodiment, the gate dielectric layer and gate electrode layer also serves as a capacitor dielectric and top capacitor electrode of the upper portion of the capacitor. The gate layers are patterned to form gates 530 in the transistor region and upper portion of the capacitor in the hybrid CMOS region. In the case that the hybrid CMOS region include resistors, the gate layers may also be patterned to form line structures and fillers. Patterning the gate layers may be achieved using mask and etch techniques. For example, the gate layers are patterned by RIE using a patterned resist mask. A gate includes a gate electrode 534 over a gate dielectric 532 while the upper portion of the capacitor includes a capacitor dielectric 542 below a top capacitor electrode 543.

Source/drain (S/D) regions 522 and 524 are formed adjacent to the gates. The S/D regions are heavily doped regions. For example, the first transistor includes heavily doped n-type S/D regions while the second transistor includes p-type S/D regions. Lightly doped extension regions may be provided for the S/D regions. Dielectric sidewall spacers may be provided on sidewalls of the gates to facilitate forming lightly doped regions. The spacer may also be disposed on the side of the upper capacitor portion. Separate implants may be employed to form different doped regions using, for example, implant masks, such as photoresist mask. The S/D implants may also form well contacts 528 as well as doping the top capacitor electrode. For example, p-type well contacts are formed with p-type S/D regions while n-type well contacts are formed with n-type S/D regions. The S/D implants may be employed to dope resistors in the hybrid CMOS region.

In addition, additional implants may be performed to further dope the top capacitor electrode and fillers to serve as a reflector. Also, implants may also be performed to tailor resistance of the resistor line structures.

Metal silicide contacts may be formed on the substrate. For example, metal silicide contacts may be formed on the S/D regions, gate electrodes, well contacts, top capacitor electrode, interconnect line structures and/or fillers. For example, a metal layer, such as Ti, W or Al may be deposited on the substrate and annealed to form a reaction with silicon to form metal silicide contacts. Unreacted metal is removed by, for example, a wet etch, leaving the metal silicide contacts.

Figure 5C:
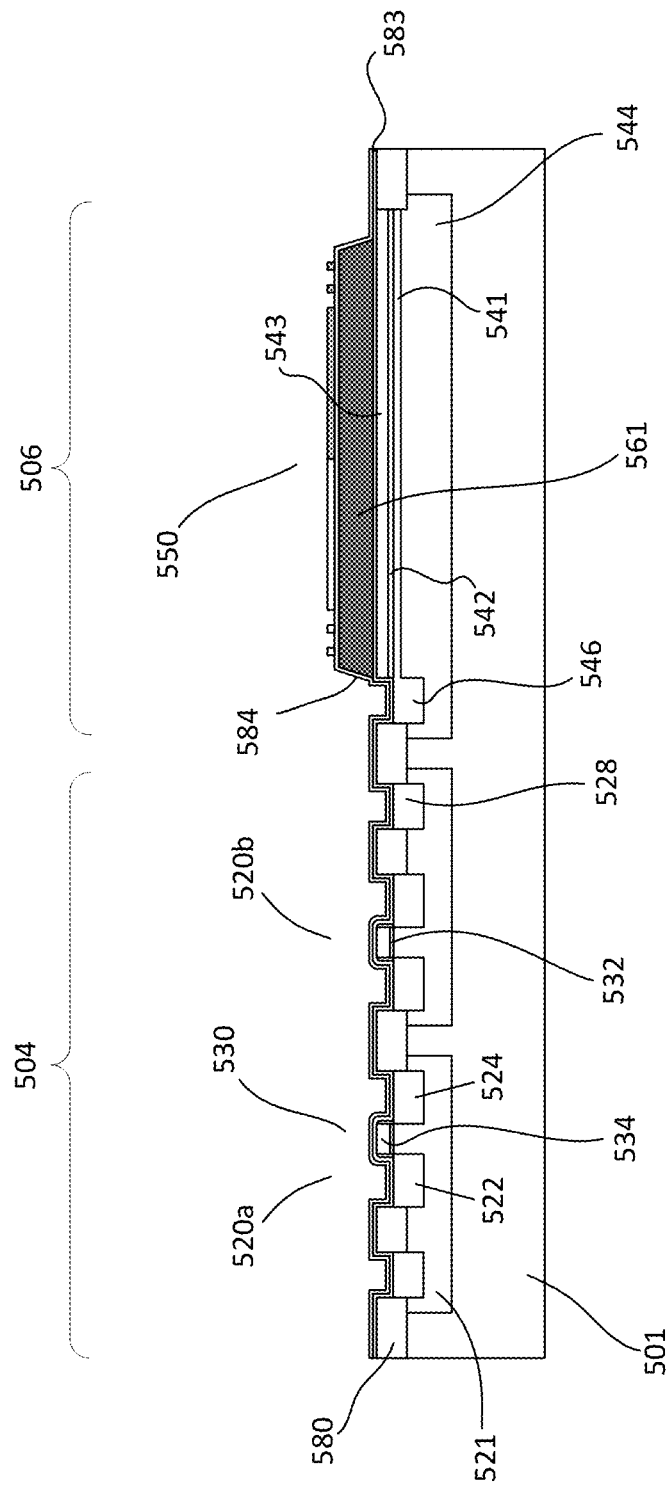

Referring to FIG. 5c, a first dielectric layer 583 is formed on the substrate. The dielectric layer lines the CMOS and hybrid region. The dielectric layer, for example, serves as a protection layer covering the hybrid CMOS component. For example, the dielectric layer protects the capacitor. The dielectric layer may be silicon oxide formed by, for example, CVD. Other types of dielectric layers may also be useful.

After forming the first dielectric layer 583, a sacrificial layer 561 is formed on the substrate. The sacrificial layer, for example, serves as a sacrificial layer for forming a lower sensor cavity in the hybrid region. In one embodiment, the sacrificial layer is a polysilicon layer. Other types of sacrificial layers may also be useful. The sacrificial layer is patterned to form a mesa corresponding to the lower sensor cavity. For example, the sacrificial layer is patterned by mask and etch processes.

A second dielectric layer 584 is formed on the substrate. The second dielectric layer lines the CMOS and hybrid regions. For example, the second dielectric layer lines the first dielectric layer and the patterned sacrificial layer. The dielectric layer serves as a lower sensor cavity structure layer. The dielectric layer may be silicon oxide formed by, for example, CVD. Other types of dielectric layers may also be useful.

Although as described, the CMOS hybrid component is a capacitor, other types of hybrid components may also be formed. For example, one or more hybrid components, as described in FIG. 2 and FIGS. 3a-3d, may be formed. For example, the process may be adjusted to form the other types of hybrid components.

In one embodiment, a MEMS structure 550 is formed on the second dielectric layer in the hybrid region. For example, the MEMS structure is formed on the second dielectric layer on top of the patterned sacrificial layer. The MEMS structure may be a sensor. The MEMS structure may be a thermoelectric sensor, such as a thermopile structure. Other types of MEMS structures may also be useful.

In one embodiment, the MEMS structure includes a line structure, such as those described in FIG. 2 and FIGS. 4a-4e. The line structure, for example, is a polysilicon line structure. Other types of thermopile materials which are stable under high temperatures may also be useful. For example, the thermopile material may be silicon germanium (SiGe), gallium nitride (GaN) or a 2D material, such as graphene, black phosphorus or molysulfide. The pattern of the line structure, for example, may be a serpentine or meandering line structure. The line structure includes first and second segments doped with first and second thermopile dopants. The first thermopile dopants are first polarity type dopants and the second thermopile dopants are second polarity type dopants. The first and second polarity type dopants are opposite polarity type dopants. The segments may be doped using separate implants with implant masks.

In the case that separate processes are used to form the MEMS structure, the CMOS region may be protected by a hard mask layer. The hard mask layer, for example, may be a dielectric layer, such as a silicon oxide or silicon nitride layer. The hard mask layer may be patterned to expose the sensor region, leaving the CMOS region protected. The hard mask layer may serve as an etch stop layer. Other types of hard mask layers may also be useful. The hard mask layer enables the MEMS structure layer to be patterned in the sensor region, while protecting the CMOS region. After forming the MEMS structure, the etch stop layer may be removed.

Figure 5D:
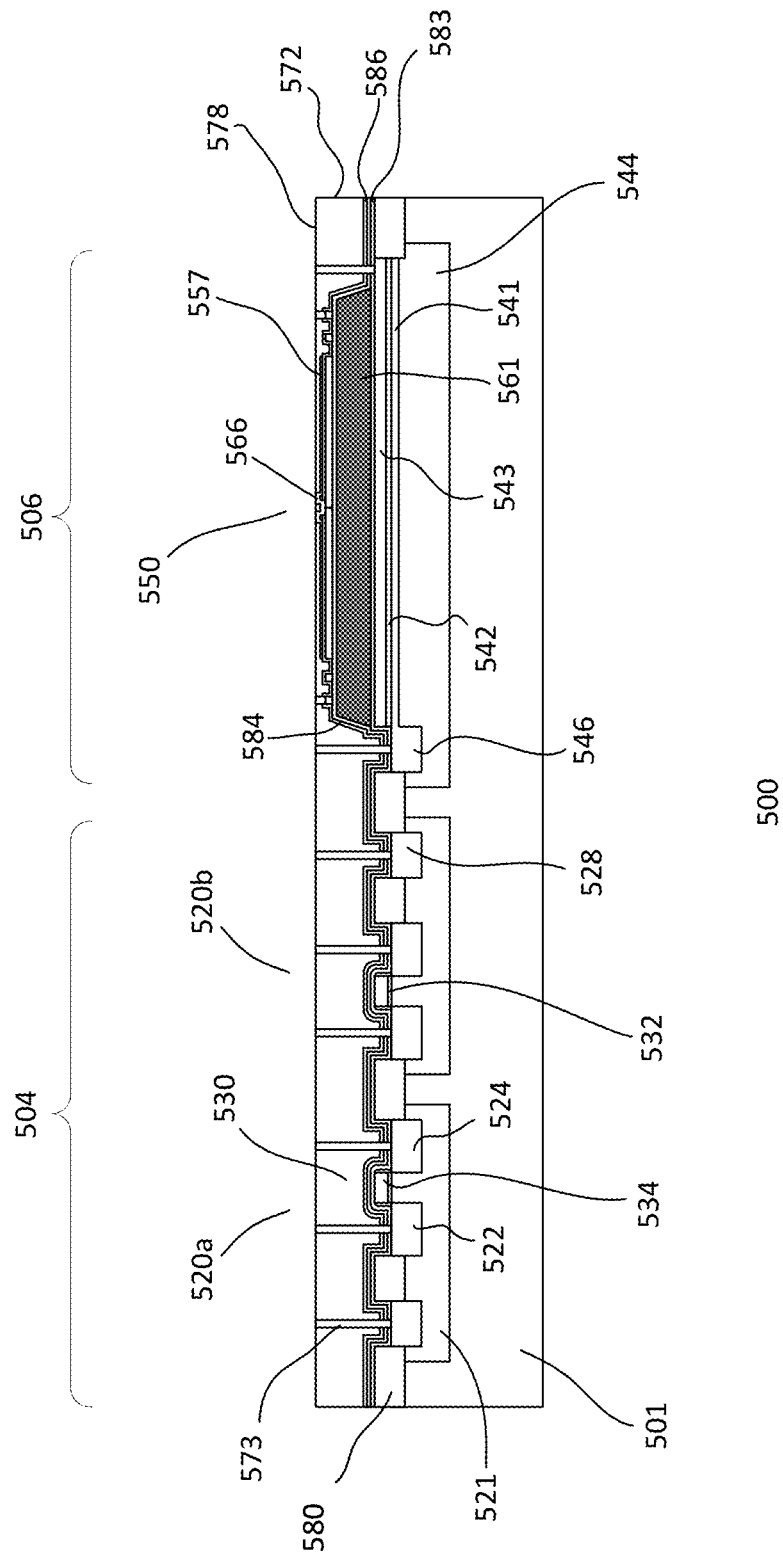

As shown in FIG. 5d, the process continues to complete the sensor. For example, a dielectric layer is formed to fill the line structure, form a metal contact 566 and an absorber layer 557. After the sensor is formed, a third dielectric layer 586 is formed on the substrate. The third dielectric layer lines the CMOS and hybrid region. For example, the third dielectric layer lines the second dielectric layer and the MEMS structure. The dielectric layer, for example, serves as a protection layer covering the MEMS structure. The dielectric layer may be silicon oxide formed by, for example, CVD. Other types of dielectric layers may also be useful.

As described, a single unstacked line structure is formed. However, it is understood that a stacked structure and/or array structure may be formed. Other configuration of MEMS structures may also be useful. For example, in other embodiments, stacked line units may be formed in the sensor region, as previously discussed with respect to FIGS. 4c-d. Forming the stacked line units may be separate from the processes to form CMOS components (CMOS processes). Partially or fully incorporating the CMOS processes for forming the stacked line units may also be useful. This, for example, may depend on the CMOS process employed. Other configuration of forming the CMOS components and MEMS structure may also be useful.

The process continues to perform back-end-of-line (BEOL) processing. The BEOL process includes forming a via dielectric layer 572 on the substrate. The via dielectric layer serves as the first via level of the first ILD layer. The via dielectric layer covers the CMOS and hybrid regions. The via layer covers the MEMS structure in the hybrid region. A planarization process is performed on the via dielectric layer to form a planar top surface 578. The planarization process, for example, may be CMP. In alternative embodiments, the dielectric layer may be a self-planarizing layer, such as spin on glass (SOG). Other types of dielectric materials may also be used.

Contacts 573 are formed in the via layer. The contacts, for example, are coupled to the various terminals in the CMOS and hybrid regions. For example, the contacts couple to the S/D regions, well contacts, hybrid CMOS component terminals and MEMS structure terminals. The contacts may be tungsten contacts. Other types of contacts may also be useful. The contacts, for example, are formed by a single damascene process. The single damascene process includes forming vias, filling the vias with a contact layer, and polishing, such as CMP, to remove excess contact material. Forming contacts using other processes may also be useful.

Figure 5E:
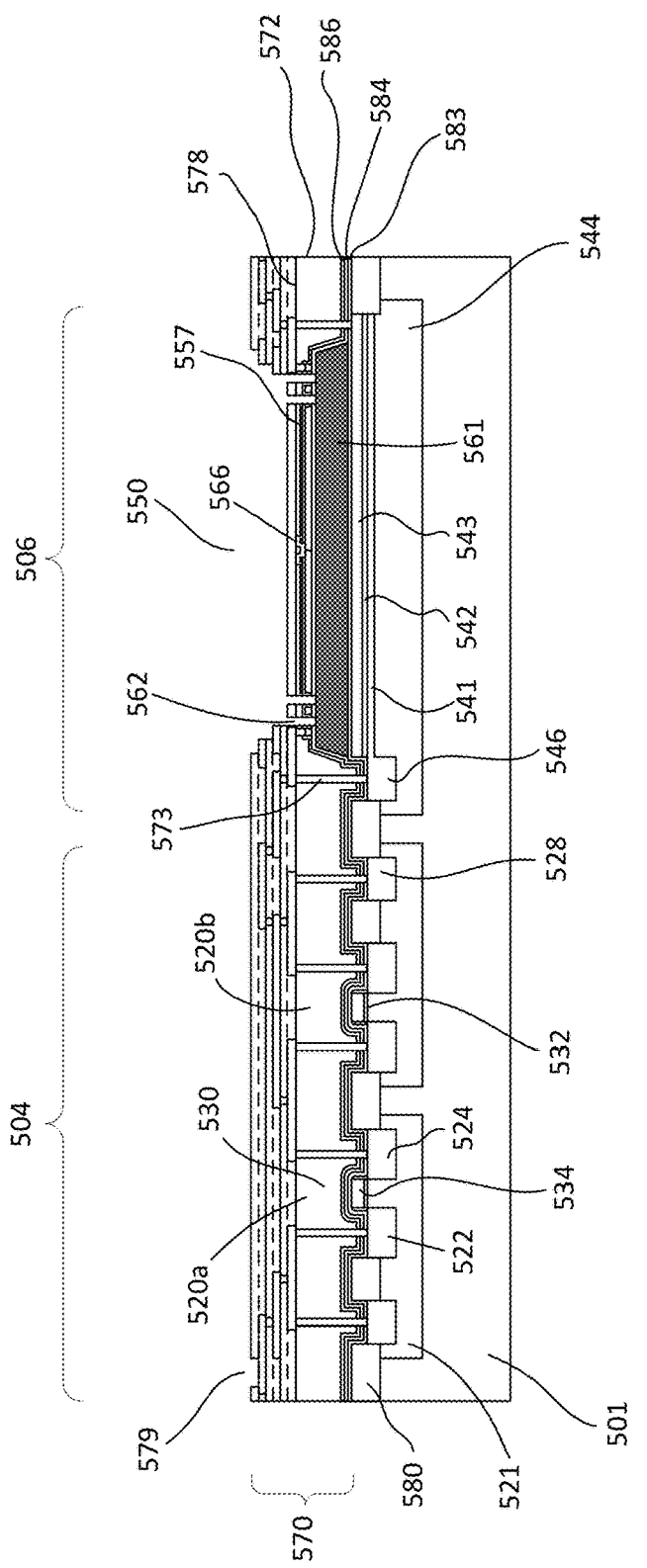

In FIG. 5e, the BEOL processing continues. In one embodiment, the BEOL dielectric with ILD levels are formed. For example, the first metal level of the first ILD level as well as additional ILD levels are formed. As discussed, a via level includes via contacts and a metal level includes metal lines. Bond pad openings 579 are formed to expose bond pads in the top metal or pad level. The BEOL dielectric is patterned to expose the hybrid region. For example, the lower metal layers of the BEOL dielectric is patterned to also serve as a line structure release etch mask for patterning the various layers to form openings for the release etch process to expose the MEMS structure. In addition, one or more openings 562 are formed to expose the sacrificial layer.

Figure 5F:
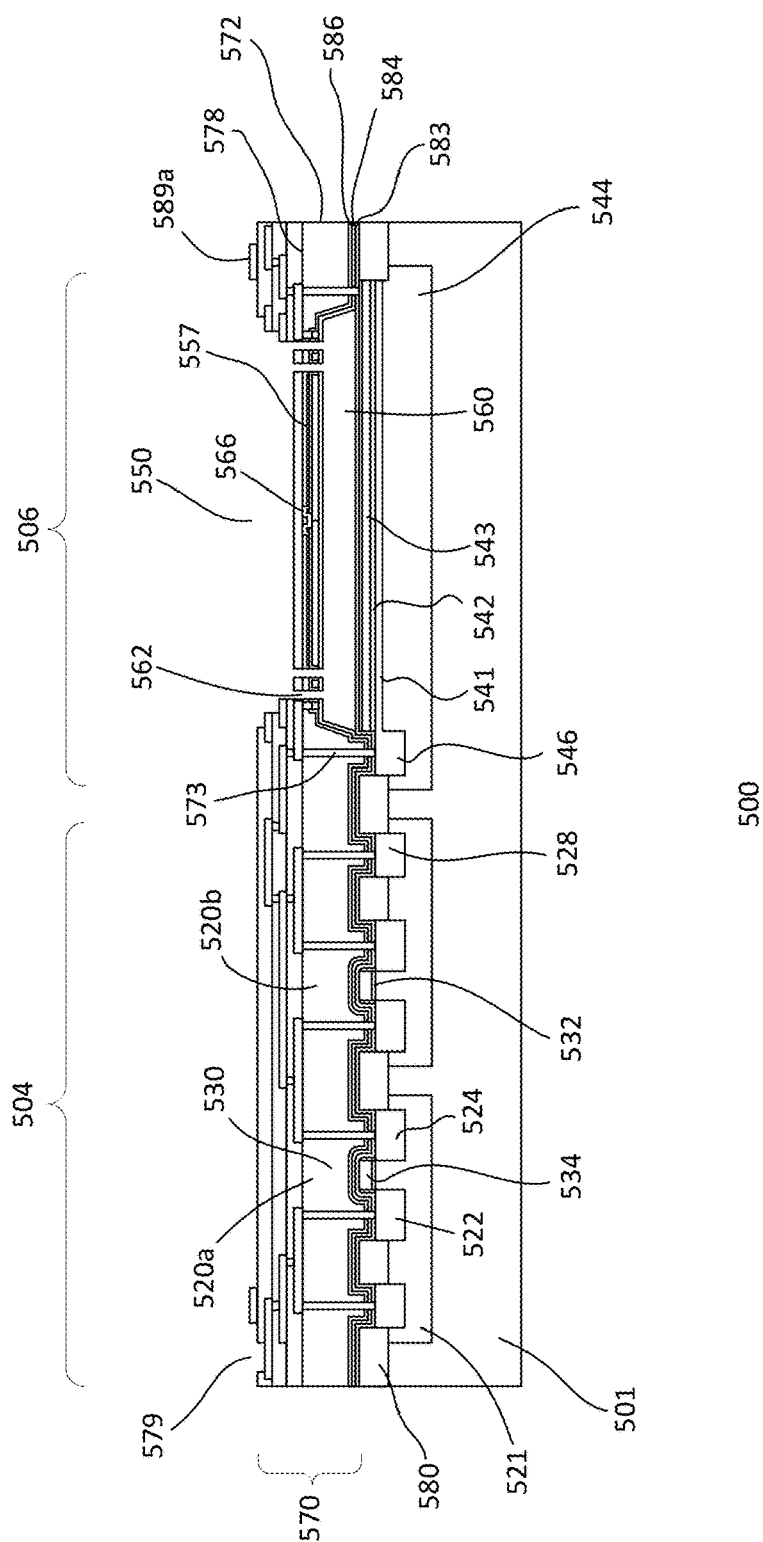

Referring to FIG. 5*f*, a bottom sealing ring 589*a* may be formed on the substrate. For example, the bottom sealing ring is formed surrounding the device. The sealing ring is formed by, for example, a lift-off process. Providing other formation techniques such as evaporation or sputtering may also be useful. The sealing ring, for example, includes a metal and facilitates subsequent thermal compression bonding with a cap. For example, the sealing rings may be a gold-based metal, such as gold or gold-tin or a combination thereof. Providing any other materials, such as copper (Cu), aluminum (Al), germanium (Ge), may also be useful.

The substrate is subjected to a release process. For example, sacrificial layer is removed to form a lower sensor cavity 560 below the MEMS structure. In one embodiment, a dry etch is performed to form the lower sensor cavity. In one embodiment, the etchant etches the sacrificial layer with high etch rate compared to the protective layers. For example, the etchant is highly selective to the silicon oxide protective layers. In one embodiment, a xenondifluoride (XeF$_2$) etchant is employed for the release process. In another embodiment, isotropic sulphur hexafluoride (SF$_6$) etchant is used as an alternative etchant to XeF$_2$. Other types of etchants or etch processes may also be useful.

Figure 5G:
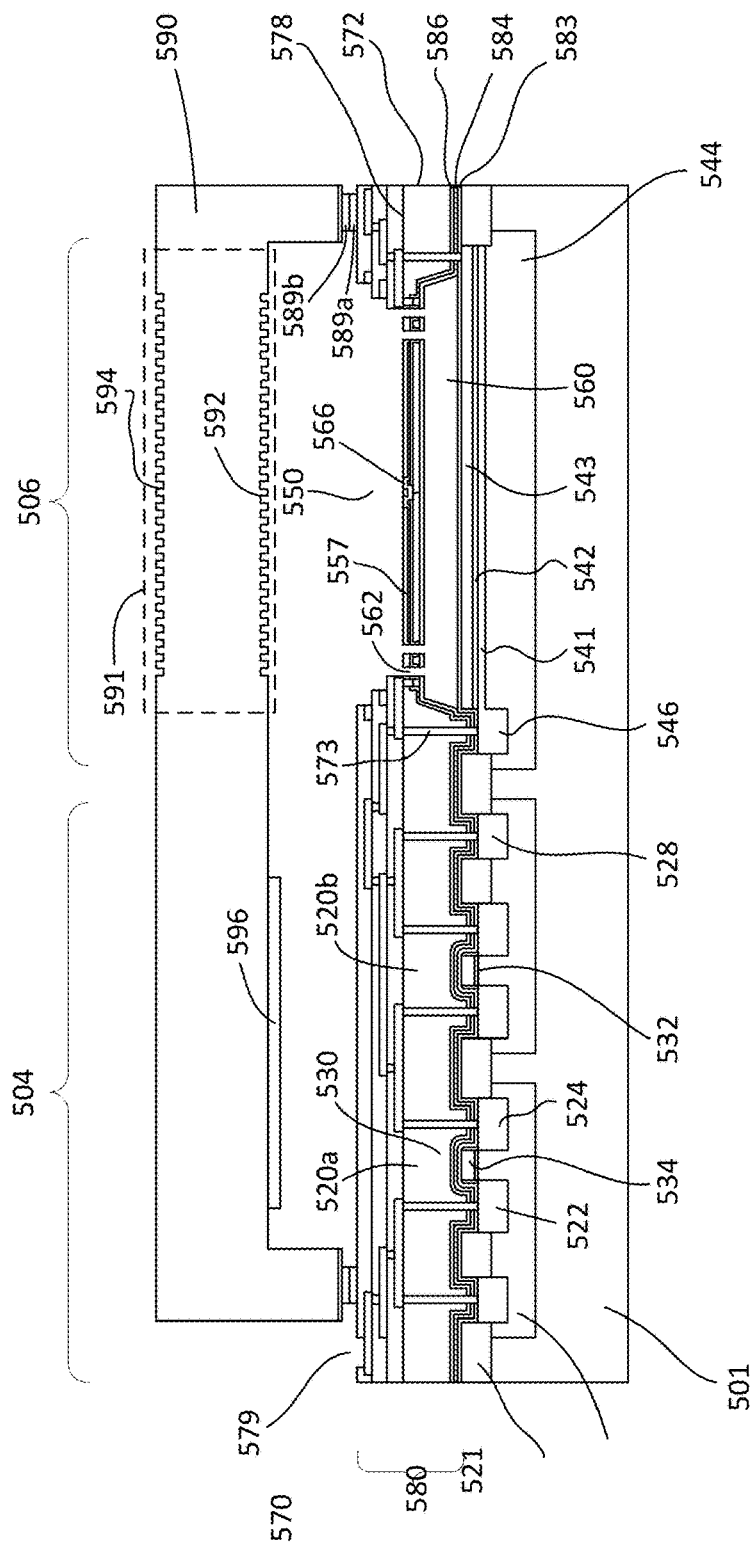

In FIG. 5*g*, the process continues to package the device. As shown, a cap is bonded to the substrate. For example, a top 589*b* sealing ring on the cap is bonded to the bottom sealing ring on the substrate. In one embodiment, thermal compression bonding may be used to bond the cap to the substrate. The cap may be bonded at the wafer level (wafer level packaging). For example, the cap is bonded prior to dicing the wafer to separate the devices. The cap, in one embodiment, is formed of a material transparent to infrared radiation. For example, the cap is capable of transmitting infrared radiation to the sensor. The cap, for example, may be a silicon cap. Other types of material which transmit infrared radiation may also be useful.

In one embodiment, the cap includes an anti-reflective region 591. The anti-reflective region facilitates transmission of infrared radiation through the cap. In one embodiment, the anti-reflective region includes bottom grating 592 on the inner (bottom) surface of the cap and top grating 594 on the outer (top) surface of the cap. The gratings can have a moth-eye grating pattern or structure to facilitate transmission of infrared radiation. Other grating patterns for the gratings may also be useful.

In one embodiment, the anti-reflective region includes anti-reflection coating disposed on the front and back sides of the cap. Materials with different reflective index may be deposited alternatively on the surfaces of the anti-reflective region. For example, materials for the anti-reflection coating may be zinc sulfide (ZnS) or germanium (Ge) and deposited in the same manner as the moth-eye grating pattern or structure. Providing any other materials and deposition techniques for the anti-reflective coating may also be useful.

In one embodiment, a getter 596 is disposed on the inner surface of the cap. The getter absorbs moisture and outgassing within the encapsulated device. The getter, for example, may be zirconium alloys, titanium (Ti), nickel (Ni), aluminum (Al), barium (Ba) or magnesium (Mg). Other types of getter materials such as rare earth element including cerium (Ce) or lanthanum (La) may also be useful. The getter facilitates maintenance of the vacuum, improving reliability. The process continues to complete the device. For example, connections or bonds are formed which connects to the bond pads to provide access to internal components of the device.

The present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A device comprising:
    a substrate including a transistor region and a hybrid region;
    a transistor component disposed in the transistor region;
    a hybrid component disposed on the substrate in the hybrid region;
    a lower sensor cavity in the hybrid region, the lower sensor cavity is disposed over the hybrid component;
    a micro-electrical mechanical system (MEMS) component disposed over the lower sensor cavity in the hybrid region; and
    a back-end-of-line (BEOL) dielectric disposed on the substrate having a plurality of inter layer dielectric (ILD) layers with metal and via levels, the metal levels include metal lines and the via levels include via contacts for interconnecting the components of the device, wherein the metal lines in the metal levels are configured to define an upper sensor cavity over the lower sensor cavity, and wherein metal lines of a first metal level of the BEOL dielectric are configured to define a geometry of the MEMS component.

2. The device of claim 1 wherein the MEMS component comprises a thermoelectric-based infrared sensor.

3. The device of claim 2 wherein the thermoelectric-based infrared sensor includes a thermopile line structure, wherein the thermopile line structure comprises
    a first line segment comprising a first polarity type first line segment; and
    a second line segment comprising a second polarity type second line segment.

4. The device of claim 3 wherein the first and second line segments form a continuous thermopile line structure coupled by a metal contact.

5. The device of claim 3 wherein the first and second line segments form a discontinuous thermopile line structure coupled by a metal contact.

6. The device of claim 2 further comprising an isolation well in the substrate which occupies the hybrid region.

7. The device of claim 6 wherein the BEOL dielectric further comprises a bottom sealing ring formed on a top surface of the BEOL dielectric and surrounding the device.

8. The device of claim 7 further comprising a cap, wherein the cap comprises:
    an upper cap portion with an outer surface;
    a lower cap portion with an inner surface; and
    a top sealing ring disposed on the lower cap portion.

9. The device of claim 8 wherein the cap further comprises an anti-reflective region, wherein the anti-reflective region includes a bottom grating on the inner surface of the cap and a top grating on the outer surface of the cap.

10. The device of claim 9 wherein the hybrid component includes at least one capacitor, wherein the at least one capacitor comprises:
   a bottom capacitor electrode disposed over the isolation well, wherein the bottom capacitor electrode is a doped electrode with a first polarity type dopant or an electrode silicide;
   a capacitor dielectric disposed over the bottom capacitor electrode;
   a top capacitor electrode disposed over the capacitor dielectric, wherein the top capacitor electrode serves as a reflector and is a doped polysilicon with capacitor dopants or an electrode silicide; and
   a protection layer disposed over the top capacitor electrode.

11. The device of claim 10 wherein the hybrid component includes a plurality of capacitors, wherein the plurality of capacitors can be connected to each other to create a larger capacitor.

12. The device of claim 9 wherein the hybrid component includes at least one resistor, wherein the at least one resistor is a highly doped polysilicon or silicided polysilicon line structure with a first terminal at a first end and a second terminal at a second end and serves as a reflector of infrared radiation.

13. The device of claim 12 wherein the hybrid component includes a plurality of resistors, wherein the plurality of resistors can be connected to each other to create a larger resistor.

14. The device of claim 9 wherein the hybrid region comprises
   a resistor region segment, wherein the resistor region segment includes
      at least one resistor, wherein the at least one resistor is a highly doped polysilicon or silicided polysilicon line structure with a first terminal at a first end and a second terminal at a second end and serves as a reflector of infrared radiation, and
      resistor fillers disposed in gaps of non-component areas; and
   a capacitor region segment, wherein the capacitor region segment includes
      at least one capacitor, wherein the at least one capacitor comprises
         a bottom capacitor electrode disposed over the isolation well, wherein the bottom capacitor electrode is a doped electrode with a first polarity type dopant or an electrode silicide,
         a capacitor dielectric disposed over the bottom capacitor electrode, and
         a top capacitor electrode disposed over the capacitor dielectric, wherein the top capacitor electrode is a doped polysilicon with capacitor dopants or an electrode silicide.

15. The device of claim 14 wherein the capacitor region segment includes a plurality of capacitors, wherein the plurality of capacitors can be connected to each other to create a larger capacitor.

16. The device of claim 14 wherein the resistor region segment includes a plurality of resistors, wherein the plurality of resistors can be connected to each other to create a larger resistor.

17. The device of claim 2 wherein the thermoelectric-based infrared sensor includes a thermopile line structure, the thermopile line structure comprises first and second line units to form a 2-line unit thermopile structure, wherein:
   the first line unit comprises a first line unit first line segment and the second line unit comprises a second line unit first line segment, wherein the first line segments of the first and second line units comprise discontinuous first polarity type first line segments disposed on a first line level;
   the first line unit comprises a first line unit second line segment and the second line unit comprises a second line unit second line segment, wherein the second line segments of the first and second line units comprise discontinuous second polarity type second line segments disposed on second first line level;
   an interline level dielectric layer disposed over the first line segments of the first and second line units which separates the second line segments of the first and second line units;
   a first metal contact coupling the first and second line segments of the first line unit; and
   a second metal contact coupling the first and second line segments of the second line unit.

18. The device of claim 17 wherein:
   the second line segment of the first line unit on the second line level overlays the first line segment of the first line unit on the first line level;
   the second line segment of the second line unit on the second line level overlays the first line segment of the first line unit on the first line level; and
   the first line unit is disposed adjacent to the second line unit in the hybrid region.

19. The device of claim 2 wherein the thermoelectric-based infrared sensor includes a thermopile line structure comprising N line units, where N≥1, wherein each of the line units comprises:
   a first polarity type first line segment;
   a second polarity type second line segment; and
   a contact coupling the first and second line segments.

20. A device comprising:
   a substrate with a hybrid region;
   a hybrid component disposed on the substrate in the hybrid region;
   a lower sensor cavity in the hybrid region, the lower sensor cavity is disposed over the hybrid component;
   a micro-electrical mechanical system (MEMS) component disposed over the lower sensor cavity in the hybrid region; and
   a back-end-of-line (BEOL) dielectric disposed on the substrate having a plurality of inter layer dielectric (ILD) layers with metal and via levels, the metal levels include metal lines and the via levels include via contacts, wherein the metal lines in the metal levels are configured to define an upper sensor cavity over the lower sensor cavity, and wherein metal lines of a first metal level of the BEOL dielectric are configured to define the MEMS component.

* * * * *